United States Patent
Hsiao

(10) Patent No.: US 10,748,599 B1
(45) Date of Patent: Aug. 18, 2020

(54) DATA READING METHOD, STORAGE CONTROLLER AND STORAGE DEVICE BACKGROUND OF THE DISCLOSURE

(71) Applicant: Shenzhen EpoStar Electronics Limited CO., Shenzhen (CN)

(72) Inventor: Yu-Hua Hsiao, Hsinchu County (TW)

(73) Assignee: Shenzhen EpoStar Electronics Limited CO., Shenzhen (CN)

( * ) Notice: Subject to any disclaimer, the term of this patent is extended or adjusted under 35 U.S.C. 154(b) by 0 days.

(21) Appl. No.: 16/503,637

(22) Filed: Jul. 5, 2019

(30) Foreign Application Priority Data

May 7, 2019 (TW) .............................. 108115696 A

(51) Int. Cl.
*G11C 11/408* (2006.01)
*G11C 16/34* (2006.01)
*G11C 11/56* (2006.01)

(52) U.S. Cl.
CPC ...... *G11C 11/4085* (2013.01); *G11C 11/5642* (2013.01); *G11C 16/3459* (2013.01); *G11C 2211/5621* (2013.01)

(58) Field of Classification Search
CPC . G11C 11/4085; G11C 16/26; G11C 16/3459; G11C 11/5642; G11C 2211/5621; G06F 11/1068
See application file for complete search history.

(56) References Cited

U.S. PATENT DOCUMENTS

2019/0179723 A1* 6/2019 Allin ..................... G06F 16/217

\* cited by examiner

*Primary Examiner* — David Lam
(74) *Attorney, Agent, or Firm* — JCIPRNET

(57) ABSTRACT

A data reading method is provided. The method includes: selecting a target physical page of a target wordline of a rewritable non-volatile memory module; identifying a plurality of distinguishing code patterns corresponding to the target physical page and corresponding one or more transition read voltages; using the one or more transition read voltages to read the target physical page to obtain a distinguishing code of each of a plurality of target memory cells of the target physical page; using one or more assisting read voltage sets corresponding to the one or more transition read voltages to read the target page to obtain an assisting bit value of each of the target memory cells of the target physical page; and combining the distinguishing code and the assisting bit value of each of the target memory cells to obtain an enhanced read bit value of each of the target memory cells.

15 Claims, 17 Drawing Sheets

DATA READING METHOD, STORAGE CONTROLLER AND STORAGE DEVICE BACKGROUND OF THE DISCLOSURE

BACKGROUND OF THE DISCLOSURE

Cross-Reference to Related Application

This application claims the priority benefit of Taiwan application serial no. 108115696, filed on May 7, 2019. The entirety of the above-mentioned patent application is hereby incorporated by reference herein and made a part of this specification.

FIELD OF THE DISCLOSURE

The disclosure relates to a data reading method, and more particularly to a data reading method adapted for a storage device and a storage controller thereof configured with a rewritable non-volatile memory module.

DESCRIPTION OF RELATED ART

In general, when a storage controller of a storage device reads data from a plurality of memory cells of a physical page of a rewritable non-volatile memory module, a preset read voltage set is used to obtain a read bit value (also referred to as a hard bit value) stored in the plurality of memory cells. If there is no need to prepare the verification data, if read failure (for example, the decoding operation of the corresponding read bit value fails) occurs, the storage controller will try to adjust the plurality of (preset) transition read voltage of the present read voltage set to obtain soft bit values, and combine soft bit values with hard bit values to obtain soft information, so that the soft information is used to provide reliability information of hard bit values to facilitate decoding operation.

However, for a physical page having more than three storage modes, the soft information obtained by the above conventional method still cannot effectively provide the reliability of the corresponding hard bit value, which causes the decoding operation to fail.

Therefore, it is an issue for practitioners of the field to find out how to efficiently provide more accurate soft information or read bit values without preparing verification data to improve the defects of conventional approaches, thereby improving the performance of decoding operation and enhance data reading efficiency of the rewritable non-volatile memory module.

SUMMARY OF THE DISCLOSURE

The present disclosure provides a data reading method, a storage controller and a storage device, which can perform read assisting operation on a specific physical page by using a distinguishing code corresponding to a specific physical page without preparing verified data, thereby obtaining more reliable read bit values and improving the efficiency of data read operation.

An embodiment of the present disclosure provides a data reading method adapted for a storage device configured with a rewritable non-volatile memory module. The rewritable non-volatile memory module has a plurality of wordlines, wherein each of the plurality of wordlines is coupled to a plurality of memory cells, wherein each of the plurality of memory cells includes a plurality of physical pages, and each of the plurality of physical pages is configured to be programmed into a bit value. The method includes: selecting a target wordline of the plurality of wordlines of the rewritable non-volatile memory module, and selecting the target physical page in the target wordline, wherein the plurality of target memory cells of the target wordline have been programmed; identifying P distinguishing code patterns corresponding to the target physical page, and identifying Q transition read voltages corresponding to the P distinguishing code patterns in the preset read voltage set according to the preset read voltage set corresponding to the target wordline, wherein the P is a positive integer, and Q is a positive integer smaller than P; reading the target physical page by using the Q transition read voltages to obtain the distinguishing code of each of the plurality of target memory cells of the target physical page; reading the target physical page by using Q assisting read voltage sets corresponding to the Q transition read voltages to obtain the assisting bit value of each of the plurality of target memory cells of the target physical page; and combining the distinguishing code and the assisting bit value of each of the plurality of target memory cells to obtain an enhanced read bit value of each of the plurality of target memory cells.

An embodiment of the present disclosure provides a storage controller for controlling a storage device configured with a rewritable non-volatile memory module. The storage controller includes: a connection interface circuit, a memory interface control circuit, a read assisting circuit unit, and a processor. The connection interface circuit is coupled to the host system. The memory interface control circuit is coupled to the rewritable non-volatile memory module, wherein the rewritable non-volatile memory module has a plurality of wordlines, wherein each of the plurality of wordlines is coupled to a plurality of memory cells, wherein each of the plurality of memory cells includes a plurality of physical pages, and each of the plurality of physical pages is programmed into a bit value. The processor is coupled to the connection interface circuit, the memory interface control circuit, and the read assisting circuit unit. The processor is configured to select a target wordline of the plurality of wordlines of the rewritable non-volatile memory module, and select a target physical page in the target wordline, wherein the plurality of target memory cells of the target wordline have been programmed. The read assisting circuit unit is configured to identify P distinguishing code patterns corresponding to the target physical page, and identify Q transition read voltages corresponding to the P distinguishing code patterns in a preset read voltage set according to the preset read voltage set corresponding to the target wordline, wherein the P is a positive integer, and Q is a positive integer smaller than P. The read assisting circuit unit is further configured to use the Q transition read voltages to read the target physical page to obtain the distinguishing code of each of the plurality of target memory cells of the target physical page. In addition, the read assisting circuit unit is further configured to read the target physical page by using Q assisting read voltage sets corresponding to the Q transition read voltages to obtain the assisting bit value of each of the plurality of target memory cells of the target physical page. Finally, the read assisting circuit unit is further configured to combine the distinguishing code and the assisting bit value of each of the plurality of target memory cells to obtain an enhanced read bit value of each of the plurality of target memory cells.

An embodiment of the disclosure provides a storage device. The storage device includes a rewritable non-volatile memory module, a memory interface control circuit, and a processor. The rewritable non-volatile memory module has a plurality of wordlines, wherein each of the plurality of wordlines is coupled to a plurality of memory cells, wherein each of the plurality of memory cells includes a plurality of physical pages, and each of the plurality of physical pages is programmed into a bit value. The memory interface control circuit is coupled to the rewritable non-volatile memory module. The processor is coupled to the memory interface control circuit, wherein the processor loads and executes a read assisting program code module to implement the data reading method. The data reading method includes: selecting a target wordline of the plurality of wordlines of the rewritable non-volatile memory module, selecting the target physical page in the target wordline, and performing a read assisting operation on the target physical page, wherein the plurality of target memory cells of the target wordline have been programmed, and the read assisting operation includes the following steps: identifying P distinguishing code patterns corresponding to the target physical page, and identifying Q transition read voltages corresponding to the P distinguishing code patterns in the preset read voltage set according to the preset read voltage set corresponding to the target wordline, wherein the P is a positive integer, and Q is a positive integer smaller than P; reading the target physical page by using the Q transition read voltages to obtain the distinguishing code of each of the plurality of target memory cells of the target physical page; reading the target physical page by using Q assisting read voltage sets corresponding to the Q transition read voltages to obtain the assisting bit value of each of the plurality of target memory cells of the target physical page; and combining the distinguishing code with the assisting bit value of each of the plurality of target memory cells to obtain an enhanced read bit value of each of the plurality of target memory cells.

Based on the above, the data reading method, the storage controller and the storage device provided in the embodiments of the present disclosure can perform the read assisting operation of the target physical page corresponding to the target wordline on any programmed target wordline without preparing the verified data. In the read assisting operation, the storage controller identifies a plurality of distinguishing code patterns corresponding to the target physical page and a plurality of corresponding transition read voltages, and respectively uses the plurality of transition read voltages and a plurality of corresponding assisting read voltage sets to obtain a plurality of distinguishing codes and a plurality of assisting bit values of the plurality of target memory cells of the target physical page to obtain an enhanced read bit value of each of the plurality of target memory cells, thereby completing the read assisting operation corresponding to the target physical page. In this way, the accuracy and reliability of the data read from the target wordline can be improved, so as to reduce the load on the decoding operation performed on the read data, thereby improving the overall efficiency of the data reading operation.

In order to make the aforementioned features and advantages of the disclosure more comprehensible, embodiments accompanying figures are described in detail below.

DESCRIPTION OF EMBODIMENTS

In the embodiment, a storage device includes a rewritable non-volatile memory module and a storage device controller (a.k.a. a storage controller or a storage control circuit). Also, the storage device is usually used together with a host system so the host system can write data into or read data from the storage device.

Figure 2:
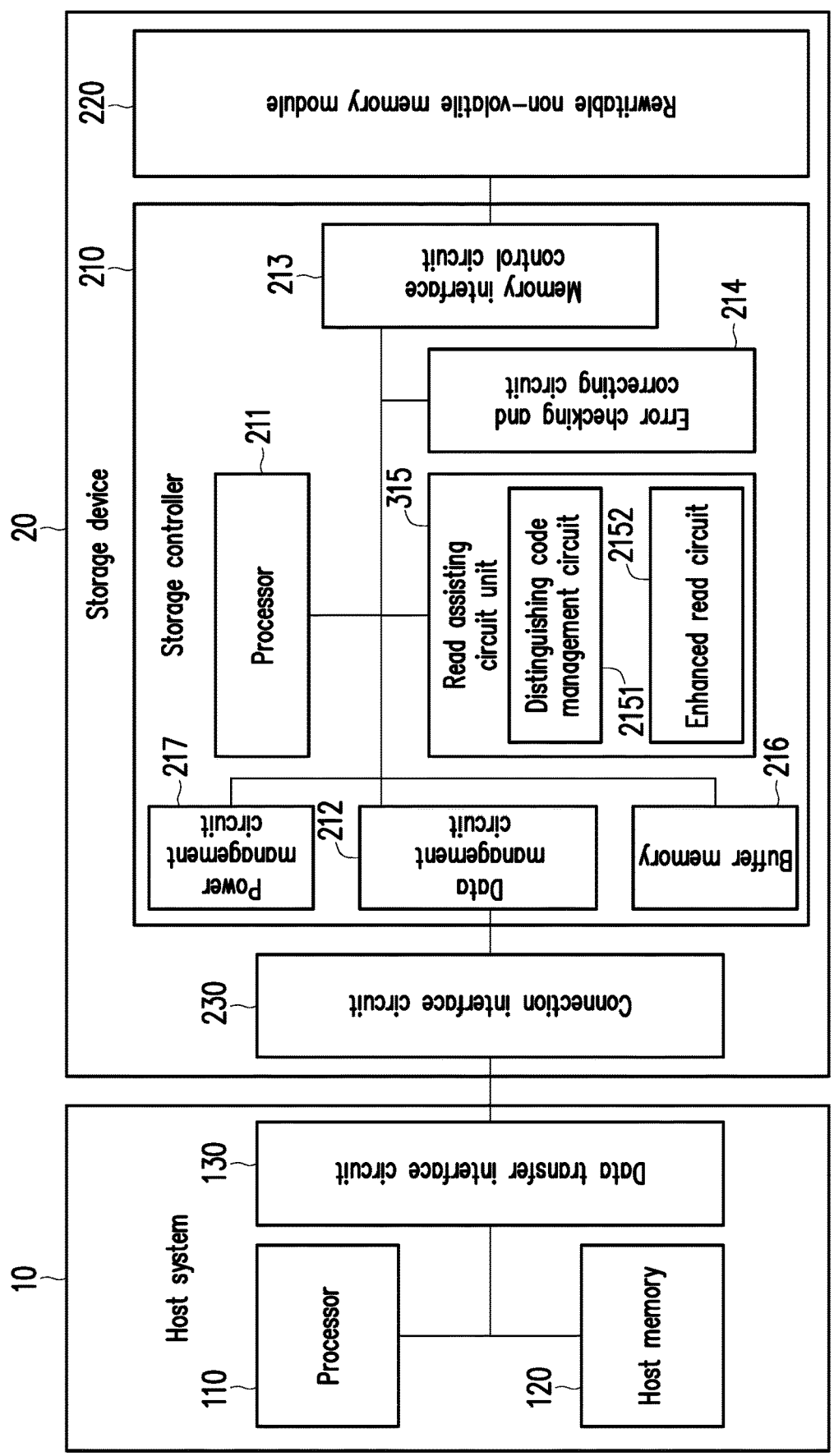
FIG. 2 is a schematic block diagram of a host system and a storage device according to an embodiment of the disclosure.

FIG. 2 is a schematic block diagram of a host system and a storage device according to an embodiment of the disclosure.

With reference to FIG. 2, a host system 10 includes a processor 110, a host memory 120 and a data transfer interface circuit 130. In this embodiment, the data transfer interface circuit 130 is coupled to (or, electrically connected to) the processor 110 and the host memory 120. In another embodiment, the processor 110, the host memory 120 and the data transfer interface circuit 130 are coupled to one another by utilizing a system bus.

A storage device 20 includes a storage controller 210, a rewritable non-volatile memory module 220 and a connection interface circuit 230. Among them, the storage controller 210 includes a processor 211, a data management circuit 212 and a memory interface control circuit 213.

In this embodiment, the host system 10 is coupled to the storage device 20 through the data transfer interface circuit 130 and the connection interface circuit 230 of the storage device 20 to perform a data accessing operation. For example, the host system 10 can store data to the storage device 20 or read data from the storage device 20 through the data transfer interface circuit 130.

In the present embodiment, the processor 110, the host memory 120 and the data transfer interface circuit 130 may be disposed on a main board of the host system 10. The number of the data transfer interface circuit 130 may be one or more. Through the data transfer interface circuit 130, the main board may be coupled to the storage device 20 in a wired manner or a wireless manner. The storage device 20 may be, for example, a flash drive, a memory card, a solid state drive (SSD) or a wireless memory storage device. The wireless memory storage device may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board may also be coupled to various I/O devices including a GPS (Global Positioning System) module, a network interface card, a wireless transmission device, a keyboard, a monitor and a speaker through the system bus.

In this embodiment, the data transfer interface circuit 130 and the connection interface circuit 230 are an interface circuit compatible with a Peripheral Component Interconnect Express (PCI Express) interface standard. Further, a data transfer is performed between the data transfer interface circuit 130 and the connection interface circuit 230 by using a communication protocol of a Non-Volatile Memory express (NVMe) interface standard.

Nevertheless, it should be understood that the disclosure is not limited to the above. The data transfer interface circuit 130 and the connection interface circuit 230 may also be compatible to a PATA (Parallel Advanced Technology Attachment) standard, an IEEE (Institute of Electrical and Electronic Engineers) 1394 standard, a Serial Advanced Technology Attachment (SATA) standard, a USB (Universal Serial Bus) standard, a SD interface standard, a UHS-I (Ultra High Speed-I) interface standard, a UHS-II (Ultra High Speed-II) interface standard, a MS (Memory Stick) interface standard, a Multi-Chip Package interface standard, a MMC (Multi Media Card) interface standard, an eMMC interface standard, a UFS (Universal Flash Storage) interface standard, an eMCP interface standard, a CF interface standard, an IDE (Integrated Device Electronics) interface standard or other suitable standards. Further, in another embodiment, the connection interface circuit 230 and the storage controller 210 may be packaged into one chip, or the connection interface circuit 230 is distributed outside a chip containing the storage controller 210.

In this embodiment, the host memory 120 is configured to temporarily store commands executed by the processor 110 or data. For instance, in this exemplary embodiment, the host memory 120 may be a DRAM (Dynamic Random Access Memory), or a SRAM (Static Random Access Memory) and the like. Nevertheless, it should be understood that the disclosure is not limited thereto, and the host memory 120 may also be other appropriate memories.

The storage unit 210 is configured to execute a plurality of logic gates or control commands, which are implemented in a hardware form or in a firmware form, and to perform operations of writing, reading or erasing data in the rewritable non-volatile memory storage module 220 according to the commands of the host system 10.

More specifically, the processor 211 in the storage controller 210 is a hardware with computing capabilities, which is configured to control overall operation of the storage controller 210. Specifically, the processor 211 has a plurality of control commands and the control commands are executed to perform various operations such as writing, reading and erasing data during operation of the storage device 20.

It should be noted that, in the present embodiment, the processor 110 and the processor 211 are, for example, a central processing unit (CPU), a micro-processor, other programmable microprocessors, a digital signal processor (DSP), a programmable controller, an application specific integrated circuits (ASIC), a programmable logic device (PLD) or other similar circuit elements. The disclosure is not limited thereto.

In an embodiment, the storage controller 210 further includes a ROM (not illustrated) and a RAM (not illustrated). More particularly, the ROM has a boot code, which is executed by the processor 211 to load the control commands stored in the rewritable non-volatile memory module 220 into the RAM of the storage controller 210 when the storage controller 210 is enabled. Then, the control commands are executed by the processor 211 to perform operations, such as writing, reading or erasing data. In another embodiment, the control commands of the processor 211 may also be stored as program codes in a specific area, for example, physical storage units in the rewritable non-volatile memory module 220 dedicated for storing system data, of the rewritable non-volatile memory module 220.

In this embodiment, as described above, the storage controller 210 further includes the data management circuit 212 and the memory interface control circuit 213. It should be noted that, operations performed by each part of the storage controller 210 may also be considered as operations performed by the storage controller 210.

The data management circuit 212 is coupled to the processor 211, the memory interface control circuit 213 and the connection interface circuit 230. The data management circuit 212 is configured to transmit data under instruction of the processor 211. For example, the data may be read from the host system 10 (e.g., the host memory 120) through the connection interface circuit 230, and the read data may be written into the rewritable non-volatile memory module 220 through the memory interface control circuit 213 (e.g., a writing operation performed according to the write command from the host system 10). As another example, the data may be read from one or more physical units of the rewritable non-volatile memory module 220 through the memory interface control circuit 213 (the data may be read from one or more memory cells in one or more physical units), and the read data may be written into the host system 10 (e.g., the host memory 120) through the connection interface circuit 230 (e.g., a reading operation performed according to a read command from the host system 10). In another embodiment, the data management circuit 212 may also be integrated into the processor 211.

The memory interface control circuit 213 is configured to perform the writing (or, programming) operation, the reading operation and the erasing operation for the rewritable non-volatile memory module 220 together with the data management circuit 212 under instruction of the processor 211.

For instance, the processor 211 may execute a write command sequence to instruct the memory interface control circuit 213 to write the data into the rewritable non-volatile memory module 220; the processor 211 can execute a read command sequence to instruct the memory interface control circuit 213 to read the data from one or more physical units (a.k.a. target physical unit) corresponding to the read command in the rewritable non-volatile memory module 220; the processor 211 can execute an erase command sequence to instruct the memory interface control circuit 213 to perform the erasing operation for the rewritable non-volatile memory module 220. Each of the write command sequence, the read command sequence and the erase command sequence may include one or more program codes or command codes, which are configured to perform the corresponding writing, reading and erasing operations on the rewritable non-volatile memory module 220. In an embodiment, the processor 211 may further send other types of command sequences to the memory interface control circuit 213 so as to perform corresponding operations on the rewritable non-volatile memory module 220.

In addition, data to be written to the rewritable non-volatile memory module 220 is converted into a format acceptable by the rewritable non-volatile memory module 220 through the memory interface control circuit 213. Specifically, if the processor 211 is to access the rewritable non-volatile memory module 220, the processor 211 transmits a corresponding command sequence to the memory interface control circuit 213 to instruct the memory interface control circuit 213 to perform a corresponding operation. For example, the command sequences may include a write command sequence instructing to write data, a read command sequence instructing to read data, an erase command sequence instructing to erase data and corresponding command sequences instructing to perform various memory operations (e.g., changing a plurality of preset read voltage values of the preset reading voltage set to perform reading operation or read assisting operation, or performing garbage collecting operation and so on). The command sequences may include one or more signals, or data from the bus. The signals or the data may include command codes and program codes. For example, information such as identification codes and memory addresses are included in the read command sequence.

The rewritable non-volatile memory module 220 is coupled to the storage controller 210 (the memory control circuit unit 213) and configured to store data written from the host system 10. The rewritable non-volatile memory module 220 may be a SLC (Single Level Cell) NAND flash memory module (i.e., a flash memory module capable of storing one bit in one memory cell), an MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), a QLC (Quadruple Level Cell) NAND flash memory module (i.e., a flash memory module capable of storing four bits in one memory cell), a 3D NAND flash memory module or a vertical NAND flash memory module and the like or any memory module having the same features. The memory cells in the rewritable non-volatile memory module 220 are disposed in an array.

In this embodiment, the rewritable non-volatile memory module 220 has a plurality of wordlines, wherein each of the plurality of wordlines is coupled to a plurality of memory cells. The memory cells on the same wordline constitute one or more physical programming units. In addition, a plurality of physical programming units may constitute one physical unit (a physical block or a physical erasing unit). In the embodiment, the triple level cell (TLC) NAND flash memory module is described as an example. That is, in the following embodiment, the memory cell capable of storing three bit values serves as a physical programming unit (that is, in each programming operation, the programming voltage is applied to one physical programming unit after another to program data), wherein each memory includes a lower physical page, a middle physical page and an upper physical page capable of storing one bit value respectively.

In this embodiment, the memory cell is used as a minimum unit for writing (programming) data. The physical unit is the minimum unit for erasing data. That is, each physical unit contains a minimum number of memory cell that is erased.

The following embodiment is exemplified with a TLC NAND flash memory module, and a page-level read assisting operation is performed on a specific physical page (e.g., one of lower physical page, middle physical page and upper physical page) of a specific wordline in the TLC NAND flash memory module. The data reading method used in the read assisting operation is also described below. However, the page-level read assisting operation and data reading method provided in the embodiment of the disclosure may also be applied to other types of flash memory module.

The storage controller 210 assigns a plurality of logical units for the rewritable non-volatile memory module 220. The host system 10 accesses user data stored in a plurality of physical units through the assigned logical units. Here, each of the logical units may be composed of one or more logical addresses. For example, the logical unit may be a logical block, a logical page, or a logical sector. One logical unit may be mapped to one or more physical units, wherein the physical unit may be one or more physical addresses, one or more physical sectors, one or more physical programming units or one or more physical erasing units. In the embodiment, the logical unit is a logical block, and the logical sub-unit is a logical page. Each of the logical units has multiple logical sub-units.

Additionally, the storage controller 210 would create a logical-to-physical address mapping table and a physical-to-logical address mapping table for recording a mapping relation between the logical unit (e.g., logical blocks, logical pages, or logical sectors) assigned to the rewritable non-volatile memory module 220 and the physical units (e.g., physical erasing units, physical programming units, physical sectors). In other words, the storage controller 210 can look up for the physical unit mapped by one logical unit by using the logical-to-physical address mapping table, and the storage controller 210 can look up for the logical unit mapped by one physical unit by using the physical-to-logical address mapping table. Nonetheless, the technical concept for the mapping relation between the logical units and the physical units is a well-known technical means in the field, which is not repeated hereinafter.

In this embodiment, the error checking and correcting circuit 214 is coupled to the processor 211 and configured to execute an error checking and correcting procedure to ensure correctness of data. Specifically, when the processor 211 receives the write command from the host system 10, the error checking and correcting circuit 214 generates an ECC (error correcting code) and/or an EDC (error detecting code) for data corresponding to the write command, and the processor 211 writes data corresponding to the write command and the corresponding ECC and/or the EDC into the rewritable non-volatile memory module 220. Then, when the processor 211 reads the data from the rewritable non-volatile memory module 220, the ECC and/or the EDC corresponding to the data are also read, and the error checking and correcting circuit 214 performs the error checking and correcting procedure on the read data based on the ECC and/or the EDC. In addition, after the error checking and correcting process is performed, if the read data is successfully decoded, the error checking and correcting circuit 214 can feedback the error bit counts to the processor 211.

In an embodiment, the storage controller 210 further includes a buffer memory 216 and a power management circuit 217. The buffer memory 216 is coupled to the processor 211 and configured to temporarily store data and commands from the host system 10, data from the rewritable non-volatile memory module 220 or other system data for managing the storage device 20 so the processor 211 can rapidly access the data, the command or the system data from the buffer memory 216. The power management circuit 217 is coupled to the processor 211 and configured to control power of the storage device 20.

In the present embodiment, the read assisting circuit unit 215 includes a distinguishing code management circuit 2151 and the enhanced read circuit 2152. The read assisting circuit unit 215 is configured to perform read assisting operation on a plurality of wordlines. More specifically, at a specific time point, the processor 211 can select one wordline (a.k.a. a target word line) among the plurality of wordlines belonging to a plurality of physical units of the rewritable non-volatile memory module 220 and a specific physical page (a.k.a. a target physical page) of the target wordline, and instruct the read assisting circuit unit 215 to perform the read assisting operation on the target physical page of the target wordline.

For instance, the specific time point includes, but not limited to: (1) when the decoding operation is failed; (2) when the read operation is performed on the physical page of the wordline with a poorer physical state (e.g., a wordline with higher erase count, higher read count, longer retention time or higher error bit count); or (3) when the number of error bits of data read from one wordline exceeds an error bit amount threshold.

Specifically, when the error bit count of the data read from one physical page corresponding to one wordline exceeds the error bit count threshold, the wordline is selected as the target wordline and the physical page is selected as the target physical page. It should be noted that, the selected target wordline is already stored with data, i.e., programmed with data.

In addition, in general, the error checking and correcting circuit 214 can further perform a soft information operation on a specific physical page (e.g., physical page to be read) to obtain soft information. Before describing the soft information operation, the concept of storage state needs to be explained first. In this embodiment, as described above, the target wordline is stored with data. Specifically, the memory cells of each of the wordlines are configured to be programmed to store a bit value corresponding to one of a plurality of different gray codes, and a total number of the gray codes is N. N is a first predetermined positive integer greater than 2, and a value of N may be set in advance according to a type of the rewritable non-volatile memory module 220. For example, if the rewritable non-volatile memory module 220 is the MLC, N=4; if the rewritable non-volatile memory module 220 is the SLC, N=2; if the rewritable non-volatile memory module 220 is the QLC, N=16.

For descriptive convenience, the present embodiment takes the TLC NAND flash memory module as an example, in which the memory cells of the target wordline can store the bit values respectively corresponding to 8 gray codes (N=8). Details regarding the gray codes are described below with reference to FIG. 1A.

Figure 1A:
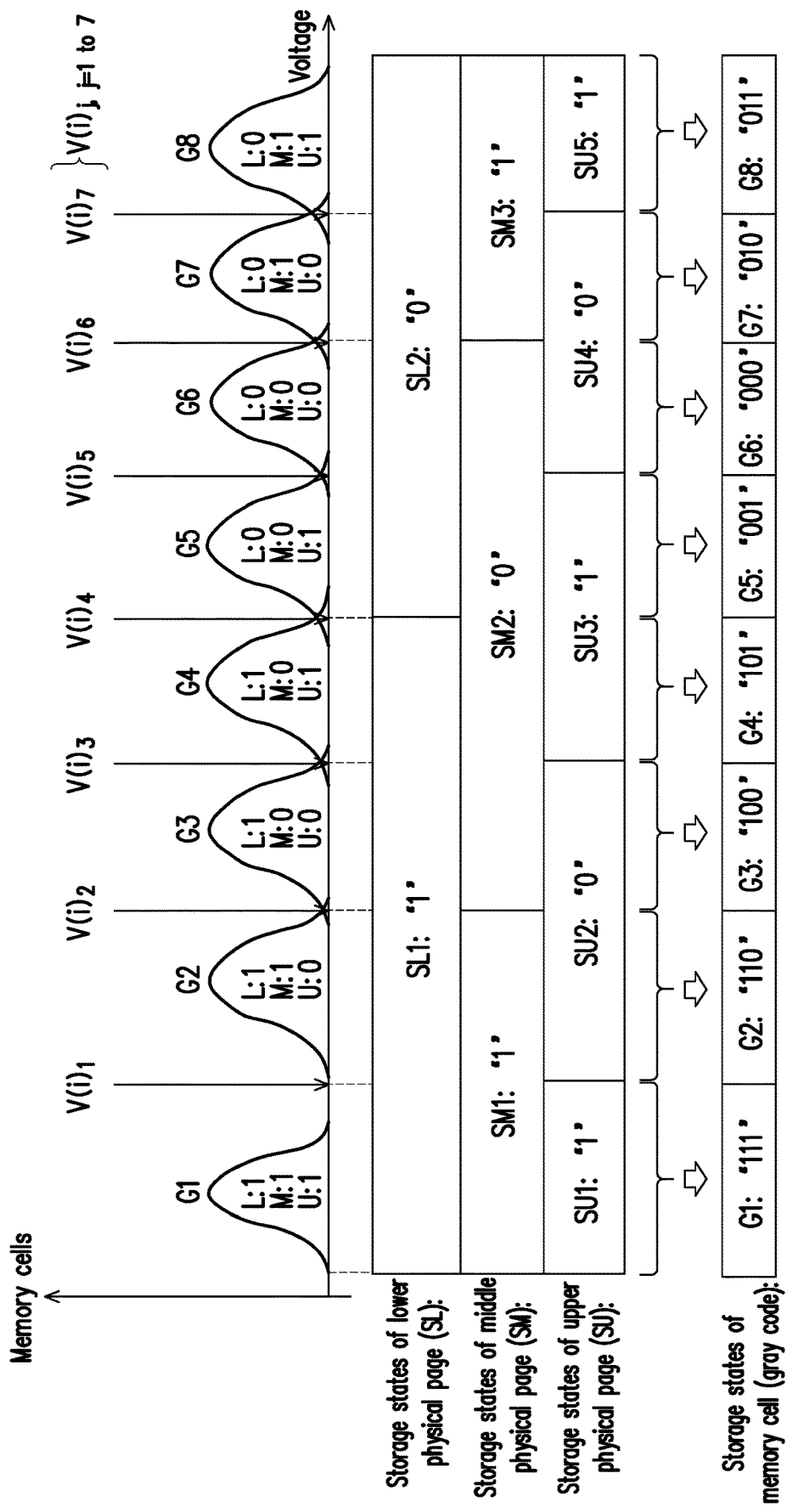
FIG. 1A is a schematic diagram illustrating threshold voltage distributions of a plurality of memory cells corresponding to N gray codes read through a read voltage set and storage states of the corresponding physical page according to an embodiment of the disclosure.

FIG. 1A is a schematic diagram illustrating threshold voltage distributions of a plurality of memory cells corresponding to N gray codes read through a read voltage set and storage states of the corresponding physical page according to an embodiment of the disclosure. Since this embodiment takes the TLC NAND flash memory module as an example of the rewritable non-volatile memory module 220, N is equal to 8 (i.e., $2^3$). Each memory cell of the TLC NAND flash memory module has three physical pages for storing bit data, respectively, and each memory cell includes the lower physical page (L), the middle physical page (M) and the upper physical page (U), each of which is capable of storing one bit value. It is assumed that, the processor 211 reads a plurality of memory cells (a plurality of target memory cells) of the target wordline of the TLC NAND flash memory module through a plurality of read voltages $V(i)_1$ to $V(i)_7$ in a read voltage set V(i), and accordingly identifies the different bit values stored by the memory cells (the bit values respectively corresponding to the different gray codes). According to the preset read voltages $V(i)_1$ to $V(i)_7$ in the read voltage set V(i) (e.g., the preset read voltage set with the corresponding i equal to 1), a gate voltage in each memory cell may be divided into 8 gray codes, such as "L:1 M:1 U:1", "L:1 M:1 U:0", "L:1 M:0 U:0", "L:1 M:0 U:1", "L:0 M:0 U:1", "L:0 M:0 U:0", "L:0 M:1 U:0" and "L:0 M:1 U:1" ("L:" indicates the bit value of the lower physical page; "M:" indicates the bit value of the middle physical page; "U:" indicates the bit value of the upper physical page). The 8 gray codes may also be expressed by 8 bit value combinations, including "111", "110", "100", "101", "001", "000", "010" and "011". Here, an order of the bit values in each bit value combination is based on an order of the lower, middle and upper physical pages in that sequence. In other words, by applying the read voltages $V(i)_1$ to $V(i)_7$ with different voltage values in the read voltage set V(i) to one memory cell of the target wordline, the processor 211 can determine the bit value stored by that memory cell (a.k.a. bit data or a read bit value) corresponding to one of the gray codes ("111", "110", "100", "101", "001", "000", "010" and "011") according to whether a channel of that memory cell is turned on (i.e., using the read voltage set V(i) to read the read bit value from the one memory of the target wordline). It should be noted that, based on the number of the gray codes that can be included by the memory cell of the rewritable non-volatile memory module 220 (which is 8 in this example), the number of the read voltages in each read voltage set is the number of the gray codes minus one (which is 7 in this example, i.e., N−1=8−1=7).

More specifically, the gray code stored by one memory may be formed by storage states of the lower physical page (SL), storage states of the middle physical page (SM) and storage states of the upper physical page (SU) in that sequence (as shown by multiple arrows in FIG. 1A).

In this embodiment, the read voltage $V(i)_4$ is configured to divide storage states SL1 ("1") and SL2 ("0") of the lower physical page; the read voltages $V(i)_2$ and $V(i)_6$ are configured to divide storage states SM1 ("1"), SM2 ("0") and SM3 ("1") of the middle physical page; the read voltages $V(i)_1$, $V(i)_3$, $V(i)_5$ and $V(i)_7$ are configured to divide storage states SU1 ("1"), SU2 ("0"), SU3 ("1"), SU4 ("0") and SU5 ("1") of the upper physical page. The above example can also be regarded that the lower physical page has "1" transition read voltage, that is, the read voltage $V(i)_4$; the middle physical page has "2" transition read voltages, that is, read voltages $V(i)_2$ and $V(i)_6$; the upper physical page has "4" transition read voltages, that is, read voltage $V(i)_1$, $V(i)_3$, $V(i)_5$, $V(i)_7$.

The processor 211 (or the read assisting circuit unit 215) can read the wordline in sequence by using the transition read voltages corresponding to the lower physical page, the middle physical page and the upper physical page in the preset read voltage set, so as to obtain the storage states of the lower physical page, the middle physical page and the upper physical page of the plurality of memory cells of the wordlines and accordingly obtain the gray codes of the plurality of memory cells. For instance, it is assumed that the processor 211 (or the read assisting circuit unit 215) uses the read voltage V(i) to read the wordlines to obtain the plurality of gray codes of the plurality of memory cells of the wordlines. The processor 211 (or the read assisting circuit unit 215) first identifies whether the storage states of all the lower physical pages of all the memory cells are the storage state SL1 or the storage state SL2 by using the read voltage $V(i)_4$; next, the processor 211 (or the read assisting circuit unit 215) then identifies whether the storage states of all the middle physical pages of all the memory cells are the storage state SM1, the storage state SM2 or the storage state SM3 by using the read voltages $V(i)_2$ and $V(i)_6$; next, the processor 211 (or the read assisting circuit unit 215) then identifies whether the storage states of all the upper physical pages of all the memory cells are the storage state SU1, the storage state SU2, the storage state SU3, the storage state SU4 or the storage state SU5 by using the read voltages $V(i)_1$, $V(i)_3$, $V(i)_5$ and $V(i)_7$. Accordingly, the processor 211 (or the read assisting circuit unit 215) can identify the storage states of the lower physical pages, the middle physical pages and the upper physical pages of all the memory cells, and thereby identify the gray codes stored by all the memory cells.

In addition, the rewritable non-volatile memory module 220 with the characteristics of having the physical pages and the corresponding number of the transition read voltages may also be regarded as the rewritable non-volatile memory module 220 (the TLC NAND flash memory module) having a first read voltage mode (1/2/4). The so-called "1/2/4" corresponds to a total number of the transition read voltages respectively included by "the lower physical page/the middle physical page/the upper physical page".

In order to facilitate the description of the technical solution provided by the disclosure, most of the following embodiments are described with the rewritable non-volatile memory module 220 (the TLC NAND flash memory module) having the first read voltage mode (1/2/4) as an example. Nevertheless, the data reading method and the storage controller provided by the disclosure is also applicable to the rewritable non-volatile memory module 220 having other read voltage modes.

Figure 8A:
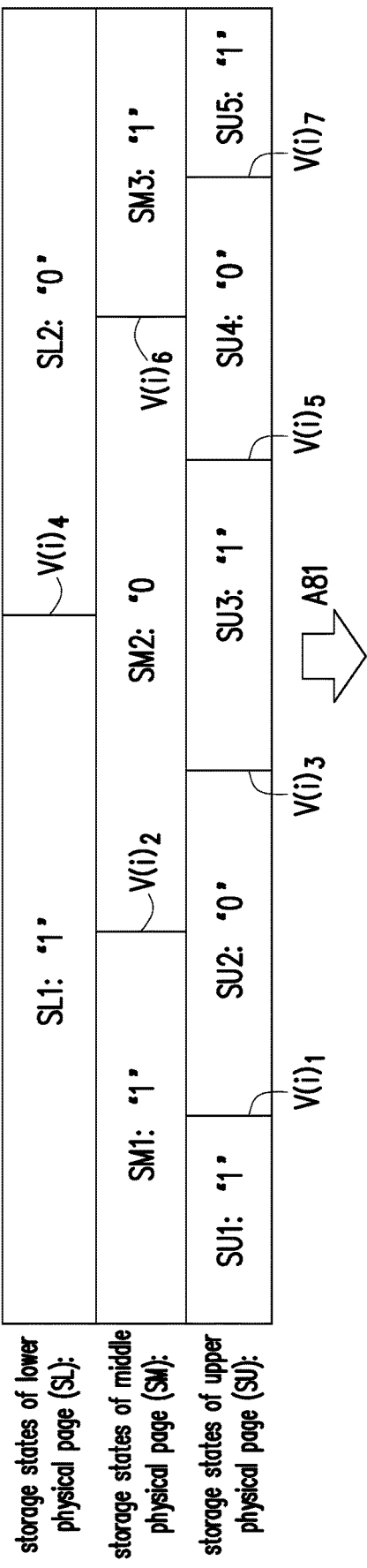
FIG. 8A is a schematic diagram of setting a distinguishing code pattern corresponding to a first read voltage mode according to an embodiment of the disclosure.
Figure 8A:
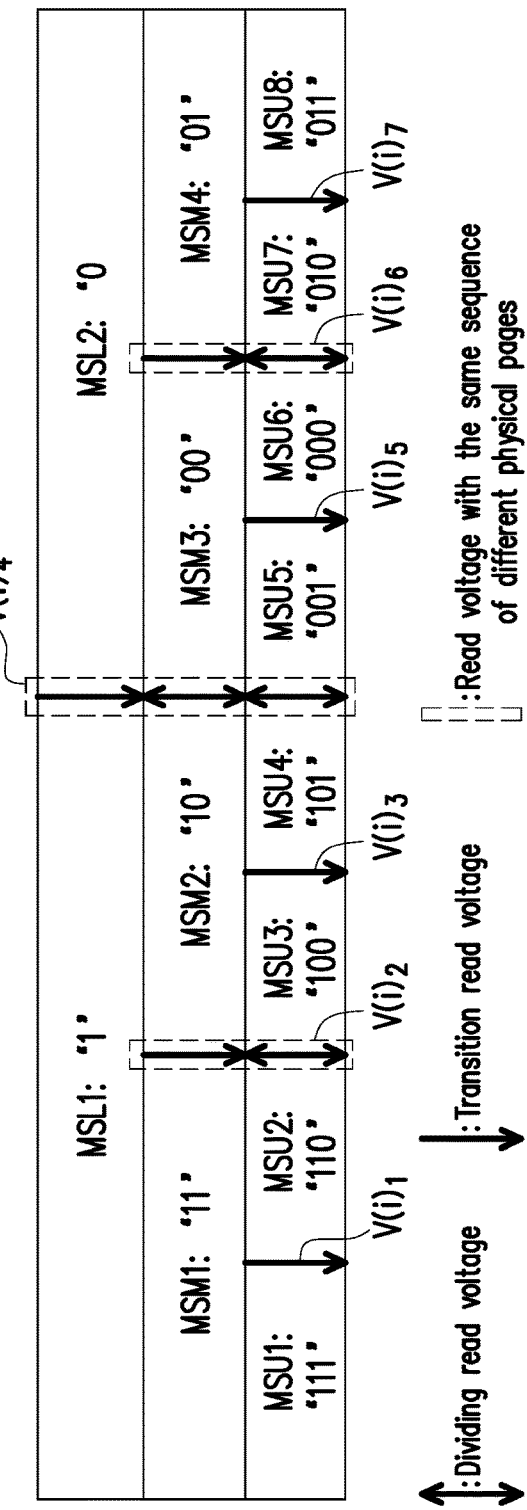
Figure 8B:
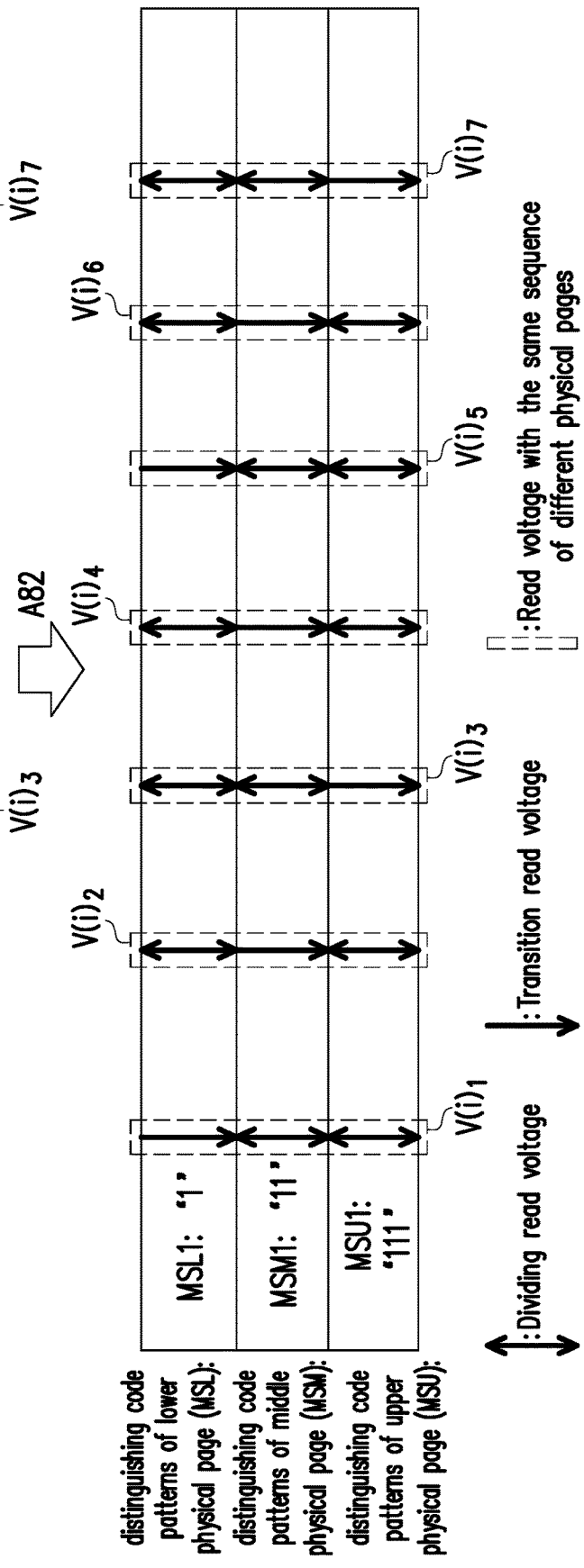
FIG. 8B is a schematic diagram of setting a distinguishing code pattern corresponding to a second read voltage mode according to an embodiment of the disclosure.

For example, in one embodiment, as shown at the top of FIG. 8B, for the rewritable non-volatile memory module 220 (the TLC NAND flash memory module) having a second read voltage mode (2/3/2), the read voltages $V(i)_1$ and $V(i)_5$ are configured to divide storage states SL1 ("1"), SL2 ("0") and SL3 ("1") of the lower physical page; the read voltages $V(i)_2$, $V(i)_4$ and $V(i)_6$ are configured to divide storage states SM1 ("1"), SM2 ("0"), SM3 ("1") and SM4 ("0") of the middle physical page; the read voltages $V(i)_3$ and $V(i)_7$ are configured to divide storage states SU1 ("1"), SU2 ("0"), and SU3 ("1") of the upper physical page. According to the above examples, it can be regarded that the lower physical page of the memory cell of the rewritable non-volatile memory module 220 (the TLC NAND flash memory module) having the second read voltage mode (2/3/2) has "2" transition read voltages, that is, the read voltage $V(i)_1$ and $V(i)_5$; the middle physical page has "3" transition read voltages, that is, read voltages $V(i)_2$, $V(i)_4$ and $V(i)_6$; the upper physical page has "2" transition read voltages, that is, read voltages $V(i)_3$ and $V(i)_7$.

In this embodiment, the threshold voltage distributions of the physical pages of the plurality of memory cells of the wordline may have an offset as compared to a preset threshold voltage distribution. Due to the offset of the threshold voltage distribution, the preset transition read voltages originally corresponding to the preset threshold voltages of the plurality of physical pages are no longer suitable for dividing the storage states of the corresponding physical pages. That is to say, in this case, the read bit values (a.k.a. hard bit values) stored by a plurality of memory cells of the originally read and identified physical page may be distorted. At this time, it is required to perform the soft information operation to obtain the soft information corresponding to the plurality of memory cells to assist the processor 211 or the error checking and correcting circuit 214 to further identify the read bit values stored by the plurality of memory cells or corresponding reliabilities.

Figure 1B:
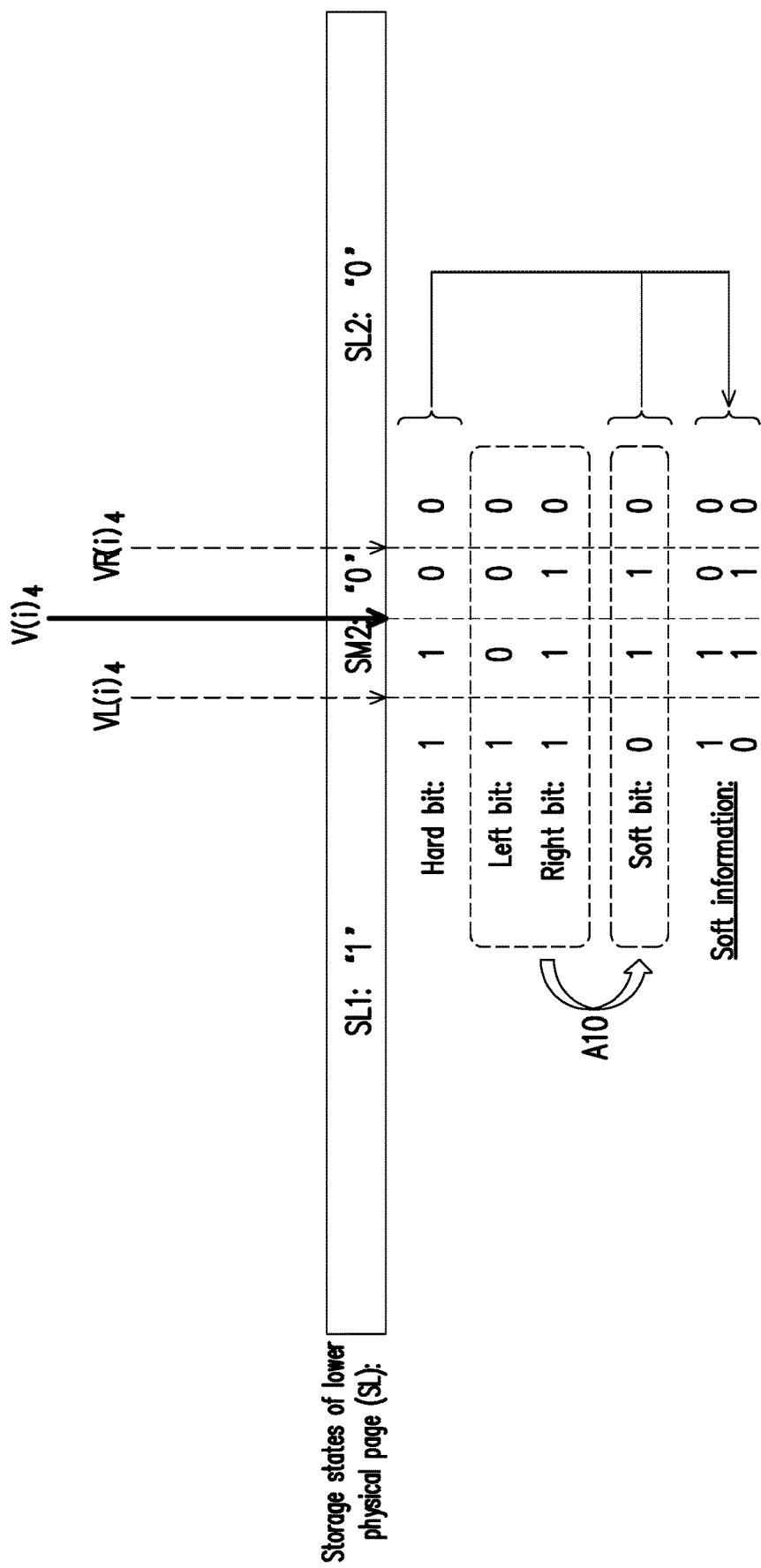
FIG. 1B is a schematic diagram of soft information generating a storage state of a lower physical page according to an embodiment of the disclosure.

FIG. 1B is a schematic diagram of soft information generating a storage state of a lower physical page according to an embodiment of the disclosure. Referring to FIG. 1B, in the embodiment, for the storage state and the hard bit value of the lower physical page, the read assisting circuit unit 215 can read the lower physical page by using the transition read voltage $V(i)_4$ and the soft bit read voltages $VL(i)_4$ and $VR(i)_4$ corresponding to the transition read voltage $V(i)_4$, thereby respectively obtaining the hard bit value "1 1 0 0" of the transition read voltage $V(i)_4$ (the bit value of the memory cell of the threshold voltage on the left side of the transition read voltage $V(i)_4$ is identified as 1, the bit value of the memory cell of the threshold voltage on the right side of the transition read voltage $V(i)_4$ is identified as 0); the left bit value "1 0 0 0" corresponding to the soft bit read voltage $VL(i)_4$ (the bit value of the memory cell of the threshold voltage on the left side of the soft bit read voltage $VL(i)_4$ is identified as 1, the bit value of the memory cell of the threshold voltage on the right side of the soft bit read voltage $VL(i)_4$ is identified as 0); and the right bit value "1 1 1 0" corresponding to the soft bit read voltage $VR(i)_4$ (the bit value of the memory cell of the threshold voltage on the left side of the soft bit read voltage $VR(i)_4$ is identified as 1, the bit value of the memory cell of the threshold voltage on the right side of the soft bit read voltage $VR(i)_4$ is identified as 0). The read assisting circuit unit 215 can generate the soft bit read voltages $VL(i)_4$ and $VR(i)_4$ corresponding to the transition read voltage $V(i)_4$ according to the transition read voltage $V(i)_4$. For instance, the soft bit read voltage $VL(i)_4$ corresponding to the transition read voltage $V(i)_4$ is a voltage which is smaller than the transition read voltage $V(i)_4$ by the first preset voltage offset; the soft bit read voltage $VR(i)_4$ corresponding to the transition read voltage $V(i)_4$ is a voltage which is greater than the transition read voltage $V(i)_4$ by the second preset voltage offset. The first preset voltage offset and the second preset voltage offset may be equal. The first preset voltage offset and the second preset voltage offset may be predetermined respectively.

As show by an arrow A10, the read assisting circuit unit 215 can perform an exclusive OR operation (XOR operation) or an exclusive NOR operation (XNOR operation) on the obtained left bit value and the right bit value to obtain an operation result, and use the operation result as the soft bit values corresponding to the plurality of memory cells. For example, the result of the XOR operation performed on the left bit value "1 0 0 0" and the right bit value "1 1 1 0" is "0 1 1 0", which is the corresponding soft bit value "0 1 1 0". The read assisting circuit unit 215 can combine the obtained soft bit value "0 1 1 0" with the hard bit value "1 1 0 0" to obtain the soft information "10 11 01 00". In each bit pair (e.g., "10") of the soft information "10 11 01 00", the first bit value of each bit pair is the hard bit value and the second bit value of each bit pair is the soft bit value.

In this way, according to the bit pair "10" in the soft information "10 11 01 00", the processor 211 or the error checking and correcting circuit 214 can know that the hard bit value "1" corresponding to the bit pair "10" is farther from an intersection of the threshold voltage distributions of the storage states SL1 and SL2, i.e., this hard bit value "1" has higher reliability (the bit of soft bit value may indicate the distance to the corresponding intersection of the threshold voltage distributions); according to the bit pair "11" in the soft information "10 11 01 00", the processor 211 or the error checking and correcting circuit 214 can know that the hard bit value "1" corresponding to the bit pair "11" is closer to the intersection of the threshold voltage distributions of the storage states SL1 and SL2, i.e., this hard bit value "1" has lower reliability; according to the bit pair "01" in the soft information "10 11 01 00", the processor 211 or the error checking and correcting circuit 214 can know that the hard bit value "0" corresponding to the bit pair "01" is closer to the intersection of the threshold voltage distributions of the storage states SL1 and SL2, i.e., this hard bit value "0" has lower reliability; according to the bit pair "00" in the soft information "10 11 01 00", the processor 211 or the error checking and correcting circuit 214 can know that the hard bit value "0" corresponding to the bit pair "00" is farther from the intersection of the threshold voltage distributions of the storage states SL1 and SL2, i.e., this hard bit value "0" has higher reliability.

It should be noted that, for descriptive convenience, the soft bit value is obtained in the embodiment according to the XOR operation.

Figure 1C:
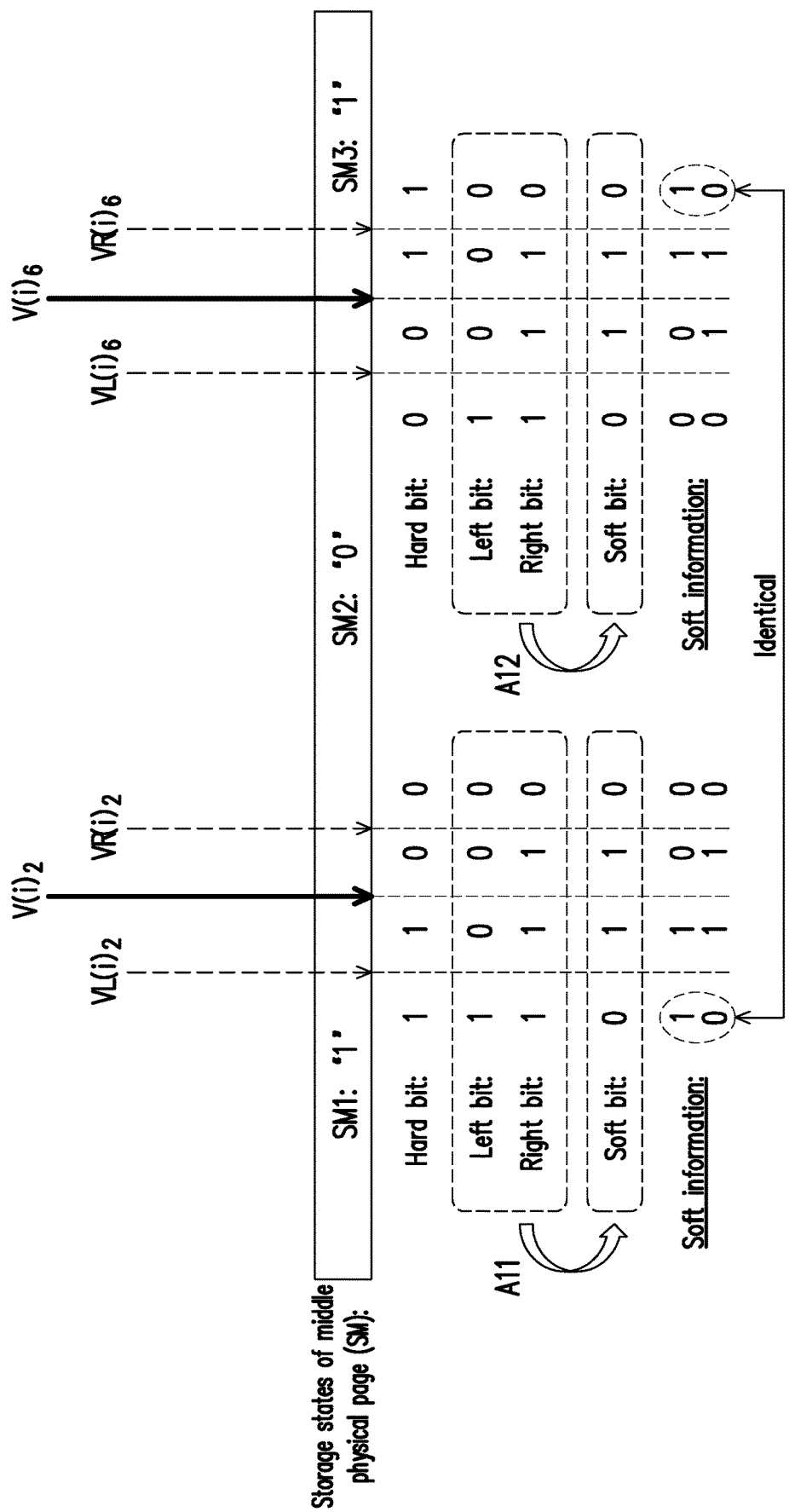
FIG. 1C is a schematic diagram of soft information generating a storage state of a middle physical page according to an embodiment of the disclosure.

FIG. 1C is a schematic diagram of soft information generating a storage state of a middle physical page according to an embodiment of the disclosure. Referring to FIG. 1C, similarly, for the storage states SM1 and SM2 of the middle physical page, the read assisting circuit unit 215 can read the middle physical page by using the transition read voltage $V(i)_2$ corresponding to the storage states SM1 and SM2, the soft bit read voltages $VL(i)_2$ and $VR(i)_2$ corresponding to the transition read voltage $V(i)_2$, thereby respectively obtaining the hard bit value "1 1 0 0" of the transition read voltage $V(i)_2$; the left bit value "1 0 0 0" corresponding to the soft bit read voltage $VL(i)_2$; and the right bit value "1 1 1 0" corresponding to the soft bit read voltage $VR(i)_2$. Next, as shown by an arrow A11, the read assisting circuit unit 215 can calculate the obtained left bit value and the right bit value through the XOR operation to obtain the corresponding soft bit value "0 1 1 0". Next, the read assisting circuit unit 215 can combine the obtained soft bit value "0 1 1 0" with the hard bit value "1 1 0 0" to obtain the soft information "10 11 01 00", which has four bit pairs "10", "11", "01" and "00".

On the other hand, for the storage states SM2 and SM3 of the middle physical page, the read assisting circuit unit 215 can read the middle physical page by using the transition read voltage $V(i)_6$ corresponding to the storage states SM2 and SM3, and the soft bit read voltages $VL(i)_6$ and $VR(i)_6$ corresponding to the transition read voltage $V(i)_6$, thereby respectively obtaining the hard bit value "0 0 1 1" of the transition read voltage $V(i)_6$; the left bit value "1 0 0 0" corresponding to the soft bit read voltage $VL(i)_6$; and the right bit value "1 1 1 0" corresponding to the soft bit read voltage $VR(i)_6$. Next, as shown by an arrow A11, the read assisting circuit unit 215 can calculate the obtained left bit value and the right bit value through the XOR operation to obtain the corresponding soft bit value "0 1 1 0". Next, the read assisting circuit unit 215 can combine the obtained soft bit value "0 1 1 0" with the hard bit value "0 0 1 1" to obtain the soft information "00 01 11 10", which has four bit pairs "00", "01", "11" and "10".

However, in the above example related to the middle physical page, since the bit pairs of the soft information "00 01 11 10" corresponding to the transition read voltage $V(i)_6$ is the same as the bit pairs of the soft information "10 11 01 00" corresponding to the transition read voltage $V(i)_2$, consequently the processor 211 or the error checking and correcting circuit 214 cannot efficiently distinguish each of the bit pairs of the soft information "00 01 11 10" from each of the bit pairs of the soft information "10 11 01 00". For example, since the first bit pair "10" of the soft information "10 11 01 00" corresponding to the transition read voltage $V(i)_2$ is the same as the fourth bit pair "10" of the soft information "00 01 11 10" corresponding to the transition read voltage $V(i)_6$, the processor 211 or the error checking and correcting circuit 214 cannot know, only based on the bit pair "10", the physical page to which the hard bit value corresponding to the bit pair "10" belongs, the corresponding transition read voltage, and the reliability of the bit pair "10".

Figure 1D:
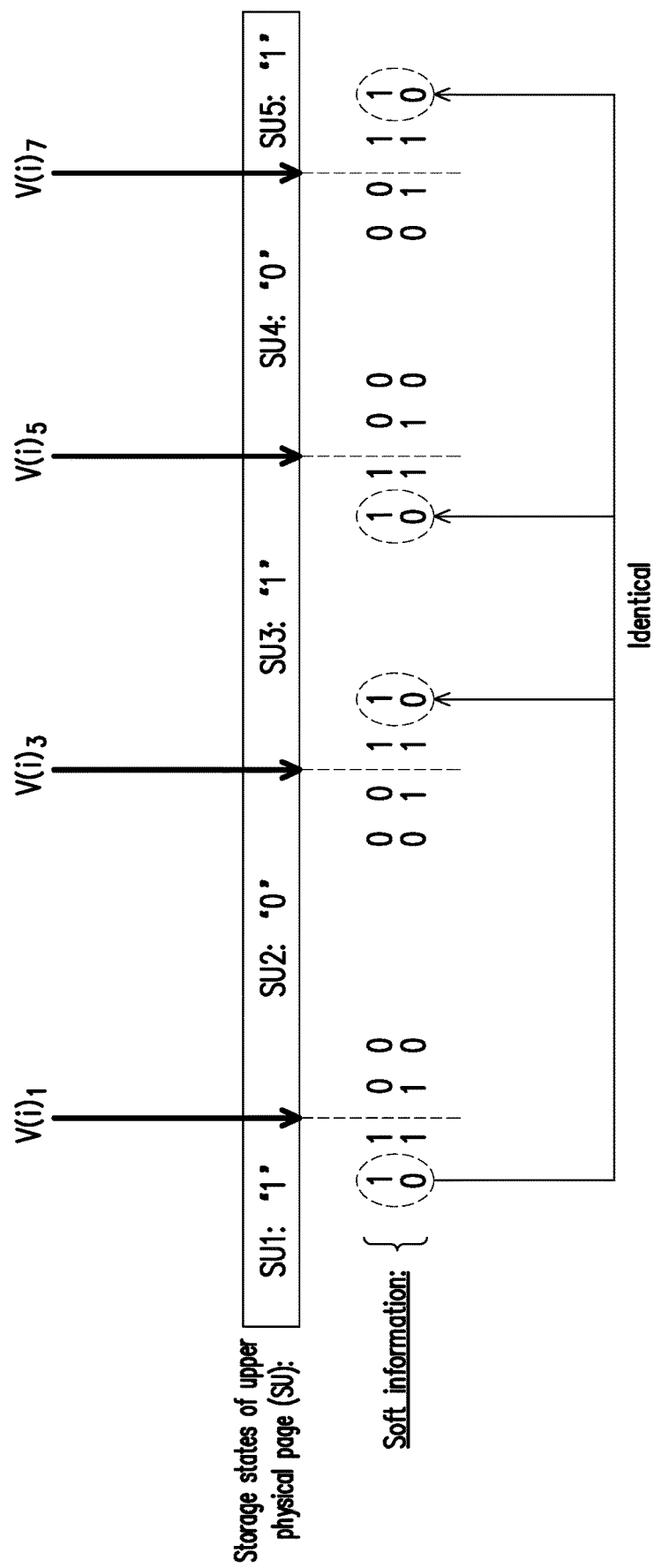
FIG. 1D is a schematic diagram of soft information generating a storage state of an upper physical page according to an embodiment of the disclosure.

FIG. 1D is a schematic diagram of soft information generating a storage state of an upper physical page according to an embodiment of the disclosure. Referring to FIG. 1D, the soft information "10 11 01 00" corresponding to the transition read voltage $V(i)_1$ obtained by the read assisting circuit unit 215 has four bit pairs "10", "11", "01" and "00"; the soft information "00 01 11 10" corresponding to the transition read voltage $V(i)_3$ has four bit pairs "00", "01", "11" and "10"; the soft information "10 11 01 00" corresponding to the transition read voltage $V(i)_5$ has four bit pairs "10", "11", "01" and "00"; the soft information "00 01 11 10" corresponding to the transition read voltage $V(i)_7$ obtained by the read assisting circuit unit 215 has four bit pairs "00", "01", "11" and "10". Since the first bit pair "10" of the soft information "10 11 01 00" corresponding to the transition read voltage $V(i)_1$ is the same as the fourth bit pair "10" of the soft information "00 01 11 10" corresponding to the transition read voltage $V(i)_3$, the first bit pair "10" of the soft information "10 11 01 00" corresponding to the transition read voltage $V(i)_5$, and the fourth bit pair "10" of the soft information "00 01 11 10" corresponding to the transition read voltage $V(i)_7$, the processor 211 or the error checking and correcting circuit 214 cannot know, solely based on the bit pair "10", the physical page to which the hard bit value corresponding to the bit pair "10" belongs, the corresponding transition read voltage, and the reliability of the bit pair "10".

That is, in order to improve the defects of the above method, the read assisting circuit unit 215 needs to use an advanced read assisting operation to obtain the read bit values stored in the plurality of memory cells of each physical page and corresponding reliability.

The data reading method provided by the embodiment of the present disclosure will be described in detail below with reference to a plurality of drawings, and the details of how the read assisting circuit unit 215 performs the reading assisting operation and the functions of the distinguishing code management circuit 2151 and the enhanced read circuit 2152 are explained.

Figure 3:
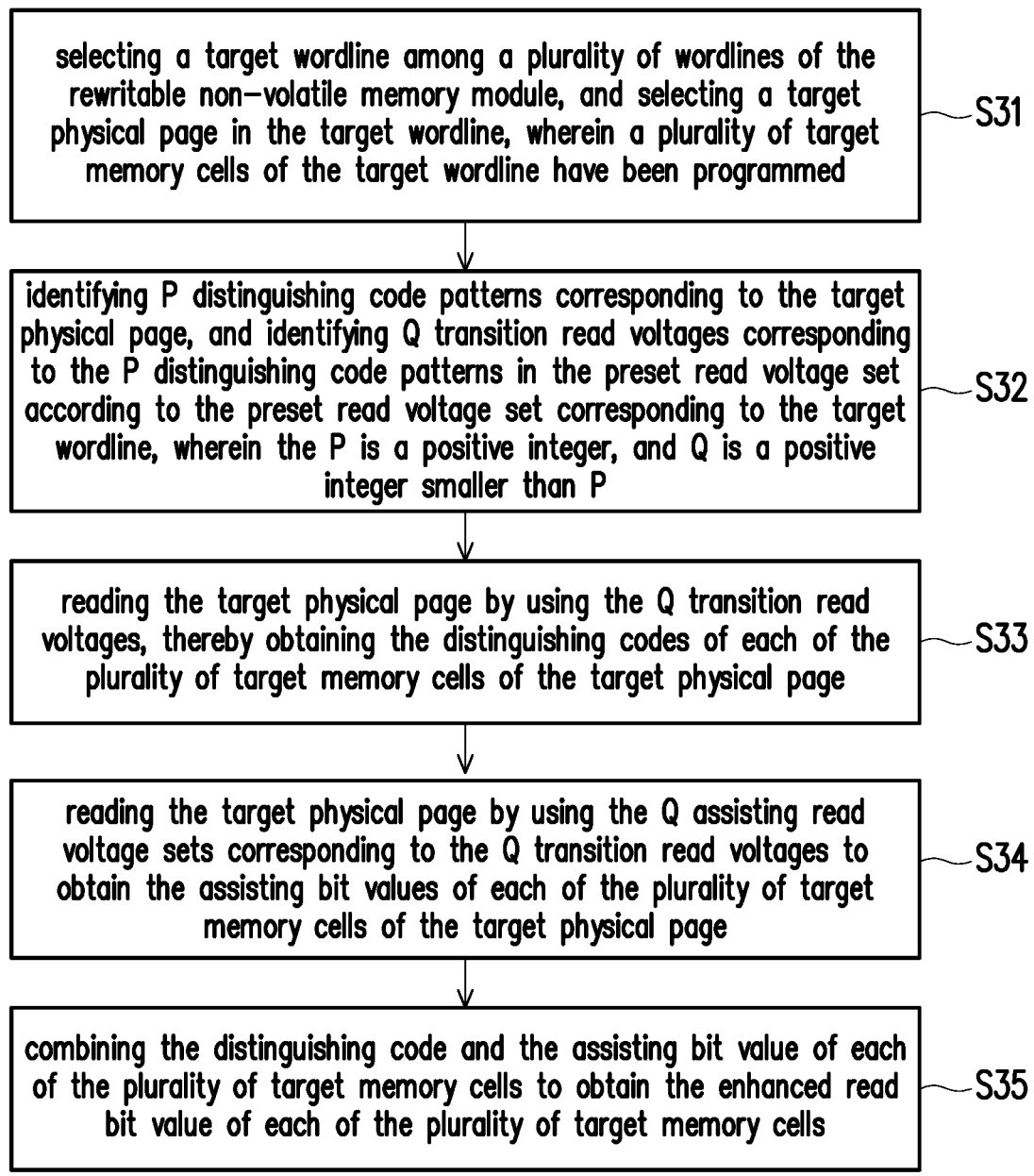
FIG. 3 is a flowchart of a data reading method according to an embodiment of the disclosure.

FIG. 3 is a flowchart of a data reading method according to an embodiment of the disclosure. Referring to FIG. 2 and FIG. 3, in step S31, the processor 211 selects a target wordline among a plurality of wordlines of the rewritable non-volatile memory module 220, and selects a target physical page in the target wordline, wherein a plurality of target memory cells of the target wordline have been programmed.

The selecting method for the target wordline and the target physical page has been described above, and will not be repeated hereinafter. It should be noted that, the disclosure is not limited by the selecting method described above. In other words, if the processor 211 intends to perform the read assisting operation in page-level on a specific physical page, that specific physical page may be regarded as the target physical page, and the wordline to which the specific physical page belongs may be regarded as the target wordline.

Then, the read assisting circuit unit 215 starts to perform a read assisting operation corresponding to the target physical page. In step S32, the read assisting circuit unit 215 (or the distinguishing code management circuit 2151) identifies P distinguishing code patterns corresponding to the target physical page, and identifies Q transition read voltages corresponding to the P distinguishing code patterns in the preset read voltage set according to the preset read voltage set corresponding to the target wordline, wherein the P is a positive integer, and Q is a positive integer smaller than P.

Specifically, in the embodiment, the read assisting circuit unit 215 (or the distinguishing code management circuit 2151) can first perform a plurality of distinguishing code pattern setting operations respectively corresponding to the plurality of physical pages through a distinguishing code pattern setting method on a plurality of physical pages (lower physical page, middle physical page, upper physical page) of the memory cells of the rewritable non-volatile memory module 220, thereby obtaining a plurality of distinguishing code patterns of each of the plurality of physical pages. The read assisting circuit unit 215 (or the distinguishing code management circuit 2151) may record the obtained a plurality of distinguishing code patterns of each of the plurality of physical pages to a distinguishing code pattern table applicable for the rewritable non-volatile rewritable memory module 220. The method for setting the distinguishing code patterns provided by the embodiment is described below with reference to FIG. 4.

Figure 4:
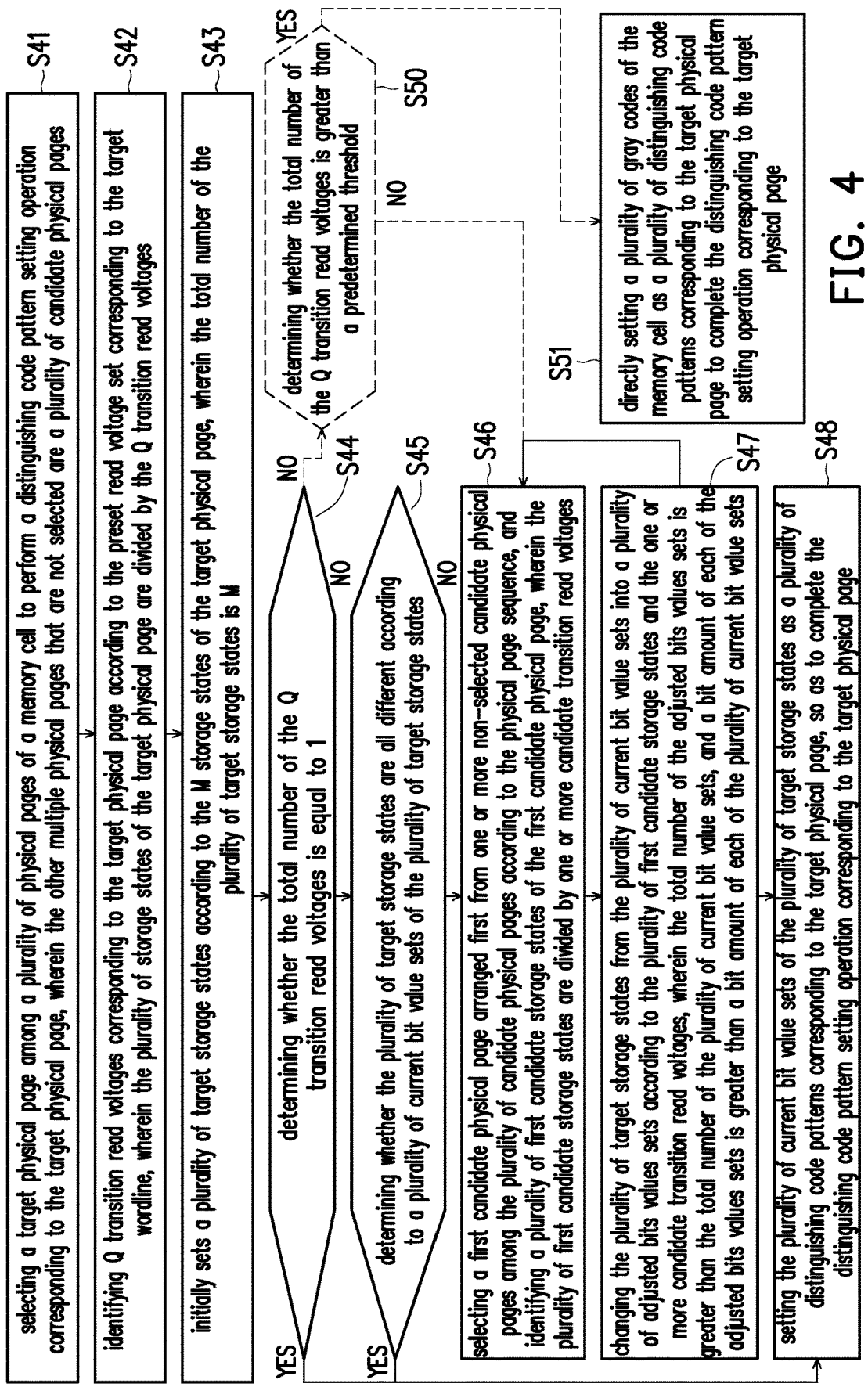
FIG. 4 is a flowchart of a method for setting a distinguishing code pattern according to an embodiment of the disclosure.

FIG. 4 is a flowchart of a method for setting a distinguishing code pattern according to an embodiment of the disclosure. Referring to FIG. 3, in step S41, the distinguishing code management circuit 2151 selects a target physical page among a plurality of physical pages of a memory cell to perform a distinguishing code pattern setting operation corresponding to the target physical page, wherein the other physical pages that are not selected are candidate physical pages. For example, it is assumed that the distinguishing code management circuit 2151 is to set a plurality of corresponding distinguishing code patterns on the lower physical page among the plurality of physical pages (lower physical page, middle physical page, upper physical page) of the memory cells of the rewritable non-volatile memory module 220. On this occasion, the lower physical page is the selected target physical page, and the middle physical page and the upper physical page are the plurality of candidate physical pages.

Next, in step S42, the distinguishing code management circuit 2151 identifies Q transition read voltages corresponding to the target physical page according to the preset read voltage set corresponding to the target wordline, wherein the plurality of storage states of the target physical page are divided by the Q transition read voltages. For example, for the rewritable non-volatile memory module 220 having the first read voltage mode (1/2/4), if the target physical page is the lower physical page, the distinguishing code management circuit 2151 can identify one transition read voltage (Q is equal to 1) $V(1)_4$ corresponding to the lower physical page according to the preset read voltage set $V(1)$; if the target physical page is the middle physical page, the distinguishing code management circuit 2151 can identify two transition read voltages (Q is equal to 2) $V(1)_2$ and $V(1)_6$ corresponding to the middle physical page according to the preset read voltage set $V(1)$; if the target physical page is the upper physical page, the distinguishing code management circuit 2151 can identify the four transition read voltages (Q is equal to 4) $V(1)_1$, $V(1)_3$, $V(1)_5$, $V(1)_7$ corresponding to the upper physical page according to preset read voltage set $V(1)$.

Next, in step S43, the distinguishing code management circuit 2151 initially sets a plurality of target storage states according to the M storage states of the target physical page, wherein the total number of the plurality of target storage states is M. For example, it is assumed that for the rewritable non-volatile memory module 220 having the first read voltage mode (1/2/4), if the target physical page is the lower physical page, the M is 2, and the plurality of target storage states are the storage state SL1 and the storage state SL2; if the target physical page is the middle physical page, the M is 3, and the plurality of target storage states are the storage state SM1, the storage state SM2, and the storage state SM3; if the target physical page is the upper physical page, the M is 5, and the plurality of target storage states are the storage state SU1, the storage state SU2, the storage state SU3, the storage state SU4, and the storage state SU5.

Next, in step S44, the distinguishing code management circuit 2151 determines whether the total number of the Q transition read voltages is equal to 1. Specifically, in response to determining that the total number of the Q transition read voltages is equal to 1, proceeding to step S48; in response to determining that the total number of the Q transition read voltages is not equal to 1, proceeding to step S45.

It should be noted that, in an embodiment, in response to determining that the total number of the Q transition read voltages is not equal to 1, the process flow does not proceed to step S45, but proceeds to step S50. In addition, in an embodiment, step S44 may be omitted, that is, step S43 may be directly followed by step S45.

Figure 5:
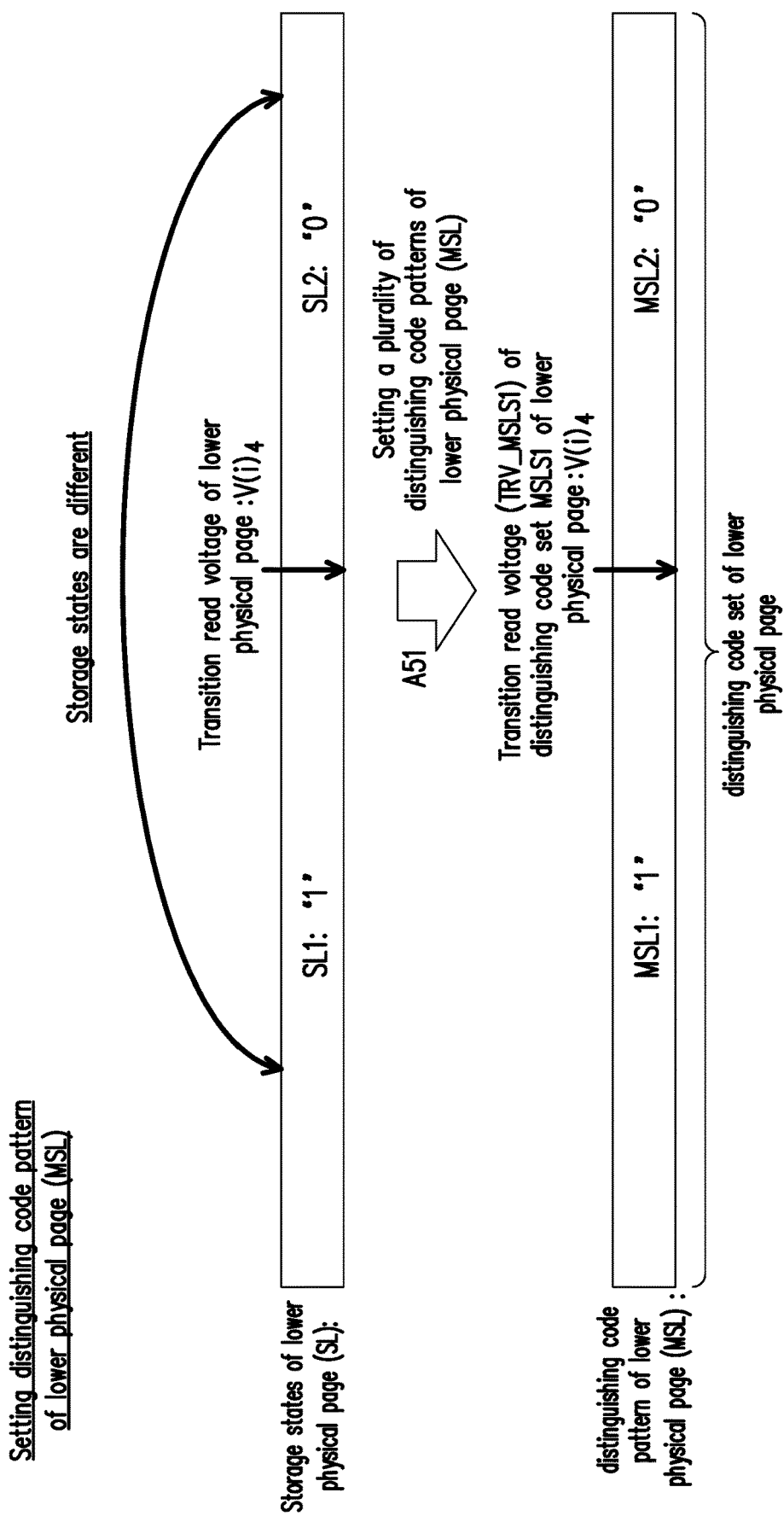
FIG. 5 is a schematic diagram of setting a distinguishing code pattern of a lower physical page according to an embodiment of the present disclosure.

In step S48, the distinguishing code management circuit 2151 sets the plurality of current bit value sets of the plurality of target storage states to a plurality of distinguishing code patterns corresponding to the target physical page, so as to complete the distinguishing code pattern setting operation corresponding to the target physical page. FIG. 5 is illustrated to describe the distinguishing code pattern setting operation in which the target physical page is the lower physical page.

FIG. 5 is a schematic diagram of setting a distinguishing code pattern of a lower physical page according to an embodiment of the present disclosure. Please refer to FIG. 5, for example, it is assumed the selected target physical page is the lower physical page. The distinguishing code management circuit 2151 performs a distinguishing code pattern setting operation corresponding to the lower physical page. Specifically, the middle physical page and the upper physical page are regarded as candidate physical pages (S41). Then, the distinguishing code management circuit 2151 identifies one (Q=1) transition read voltage $V(i)_4$ of the lower physical page according to the preset read voltage $V(i)_1$ (S42). As shown in FIG. 5, the transition read voltage $V(i)_4$ is configured to divide the two storage states SL1 and SL2 (M=2) of the lower physical page. Then, the distinguishing code management circuit 2151 initially sets a plurality of target storage states according to the two storage states of the lower physical page, that is, the current plurality of target storage states are the storage state SL1 ("1") and the storage state SL2 ("0") (S43).

Next, the distinguishing code management circuit 2151 determines that the total number (Q) of the transition read voltages of the lower physical page is equal to 1 (step S44→YES), and the distinguishing code management circuit 2151 will set the plurality of current bit value sets (i.e., "1" and "0") of the plurality of target storage states SL1 and SL2 to a plurality of distinguishing code patterns corresponding to the target physical page, thereby completing the distinguishing code pattern setting operation corresponding to the target physical page (S48). In other words, as indicated by an arrow A51 in FIG. 5, in response to determining that the total number of transition read voltages of the lower physical page is equal to 1, the distinguishing code management circuit 2151 starts to set the plurality of distinguishing code patterns (also known as the minimum discriminant code pattern MSL of the lower physical page) of the lower physical page. Specifically, the distinguishing code management circuit 2151 uses the current storage state SL1 ("1") and the storage state SL2 ("0") of the lower physical page as the plurality of distinguishing code patterns of the lower physical page. In the present example, the plurality of distinguishing code patterns of the lower physical page that are set include a distinguishing code pattern MSL1 having a bit value set "1", and a distinguishing code pattern MSL2 having a bit value set "0".

As described above, in an embodiment, step S44 can be omitted, and the process flow proceeds to step S45. In the example of FIG. 5, the distinguishing code management circuit 2151 determines that the plurality of target storage states SL1 and SL2 of the lower physical page are different (step S45→YES), and the distinguishing code management circuit 2151 performs step S48 to set a plurality of distinguishing code patterns MSL1 and MSL2 of the lower physical page according to the plurality of target storage states SL1 and SL2, thereby completing the distinguishing code pattern setting operation corresponding to the target physical page.

In this embodiment, the distinguishing code pattern MSL1 and the distinguishing code pattern MSL2 may also constitute a lower physical page distinguishing code set MSLS1. That is, the two adjacent distinguishing code patterns can be constituted into one distinguishing code set, and the constituted distinguishing code set corresponds to one transition read voltage. For example, the lower physical page distinguishing code set MSLS1 corresponds to the transition read voltage TRV_MSLS1, $V(i)_4$.

In step S45, the distinguishing code management circuit 2151 determines whether the plurality of target storage states are different according to the plurality of current bit value sets of the plurality of target storage states. In response to determining that the plurality of target storage states are different, proceeding to step S48; in response to determining that the plurality of target storage states are not all different, proceeding to step S46. For example, it is assumed the target physical page is the lower physical page, and the current bit value sets of the target storage state SL1 and the target storage state SL2 are different bit value set "1" and bit value set "0" respectively. In this example, the distinguishing code management circuit 2151 determines that the target storage state SL1 and the target storage state SL2 are all different.

In step S46, the distinguishing code management circuit 2151 selects a first candidate physical page arranged first from one or more non-selected candidate physical pages among the plurality of candidate physical pages according to the physical page sequence, and identifies a plurality of first candidate storage states of the first candidate physical page, wherein the plurality of first candidate storage states are divided by the one or more candidate transition read voltages. After selecting the first candidate physical page and identifying the plurality of first candidate storage states of the first candidate physical page, proceeding to step S47. In step S47, the distinguishing code management circuit 2151 changes the plurality of target storage states from the plurality of current bit value sets into a plurality of adjusted bits values sets according to the plurality of first candidate storage states and the one or more candidate transition read voltages, wherein the total number of the adjusted bits values sets is greater than a total number of the plurality of current bit value sets, and a bit amount of each of the adjusted bits values sets is greater than a bit amount of each of the plurality of current bit value sets. The details of steps S46 and S47 are further explained below with reference to FIG. 6.

Figure 6:
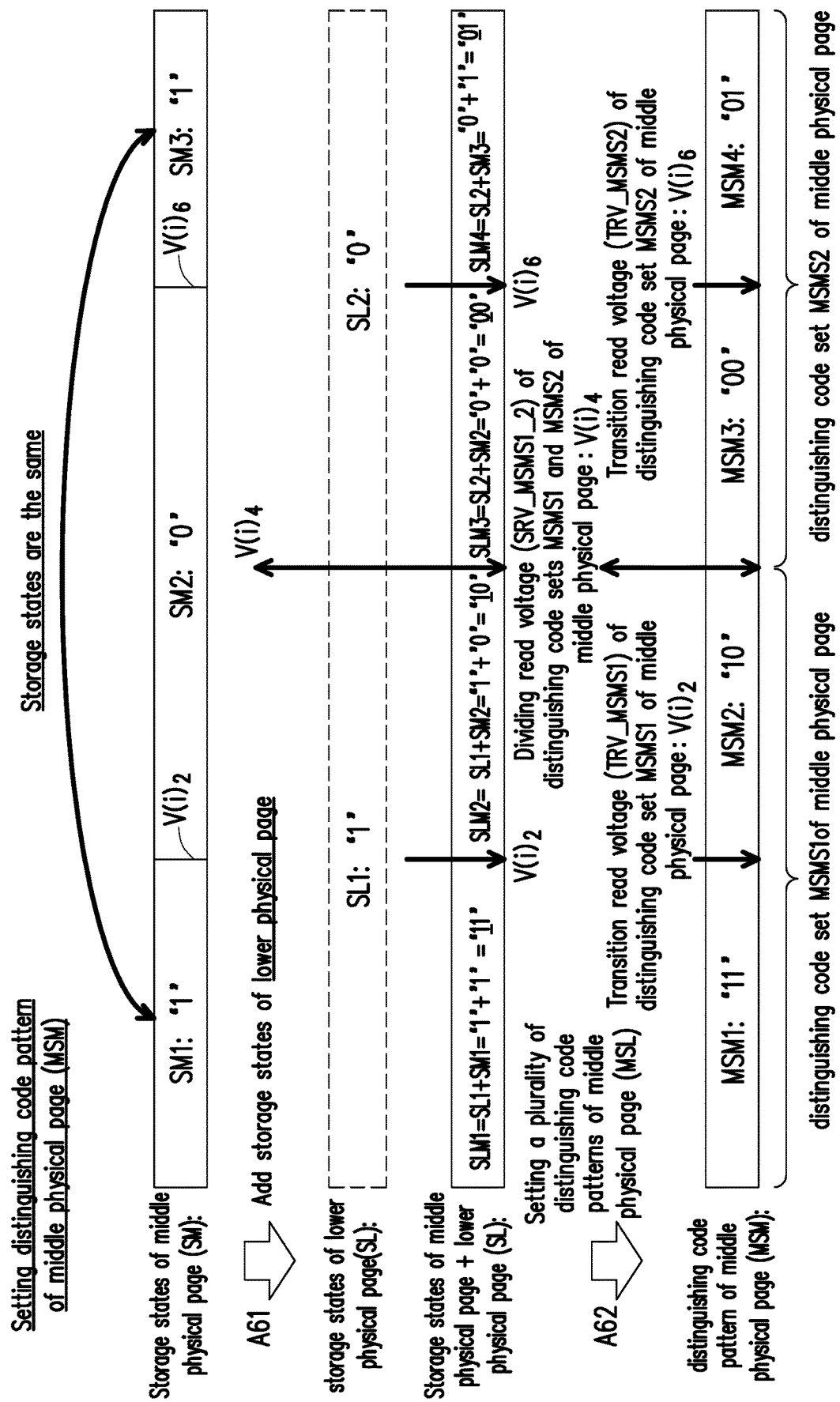
FIG. 6 is a schematic diagram of setting a distinguishing code pattern of a middle physical page according to an embodiment of the present disclosure.

FIG. 6 is a schematic diagram of setting a distinguishing code pattern of a middle physical page according to an embodiment of the present disclosure. Please refer to FIG. 6, for example, it is assumed the selected target physical page is the middle physical page. The distinguishing code management circuit 2151 performs the distinguishing code pattern setting operation corresponding to the middle physical page. Specifically, the lower physical page and the upper physical page are regarded as candidate physical pages (S41). Then, the distinguishing code management circuit 2151 identifies two (Q=2) transition read voltages $V(i)_2$ and $V(i)_6$ of the middle physical page according to the preset read voltage $V(i)_1$ (S42). As shown in FIG. 6, the transition read voltages $V(i)_2$ and $V(i)_6$ are configured to divide three storage states SM1, SM2 and SM3 (M=3) of the middle physical page. Next, the distinguishing code management circuit 2151 initially sets the plurality of target storage states SM1, SM2 and SM3 first according to the three storage states SM1, SM2 and SM3 of the middle physical page, that is, the current plurality of target storages states are the storage state SM1 ("1"), the storage state SM2 ("0"), and the storage state SM3 ("1") (S43).

Next, the distinguishing code management circuit 2151 determines that the total number of transition read voltages $V(i)_2$ and $V(i)_6$ of the middle physical page is not equal to 1 (Q=2) (step S44→No), and the distinguishing code management circuit 2151 then determines that the plurality of target storage states SM1, SM2 and SM3 are not all different (step S45→No) (e.g., the target storage state SM1 is the same as the target storage state SM2). The process flow proceeds to step S46.

In step S46, the distinguishing code management circuit 2151 selects the first candidate physical page arranged first from one or more non-selected candidate physical pages of the plurality of candidate physical pages according to the physical page sequence. In this example, the plurality of candidate physical pages are the lower physical page and the upper physical page, wherein the lower physical page is arranged prior to the upper physical page. That is, the distinguishing code management circuit 2151 selects the lower physical page as the first candidate physical page, and identifies the plurality of storage states SL1 and SL2 of the lower physical page as the plurality of first candidate storage states. The plurality of first candidate storage states SL1 and SL2 are divided by the transition read voltage $V(i)_4$. That is, the first candidate physical page corresponds to one candidate transition read voltage $V(i)_4$.

In this embodiment, in the process of performing step S47, the distinguishing code management circuit 2151 changes the plurality of target storage states from the plurality of current bit value sets into the plurality of adjusted bits values sets by adding the plurality of first candidate storage states of the first candidate physical page to the current target storage state. For example, according to the voltage value of the transition read voltage $V(i)_2$ corresponding to the target storage states SM1 and SM2 and the voltage value of the transition read voltage $V(i)_4$ of the lower physical page, the distinguishing code management circuit 2151 can identify that the storage state of the lower physical page of the plurality of memory cells, where the voltage value of the threshold voltage is smaller than the voltage value of the transition read voltage $V(i)_4$, among all memory cells of the target wordline is the storage state SL1, and the storage state of some memory cells, where the voltage value of the threshold voltage is smaller than the voltage value of the transition read voltage $V(i)_2$, among the memory cells having the storage state SL1 is the storage state SM1, and the storage state of the rest of memory cells (i.e., another remaining portion of memory cells of the memory cells where the voltage value of the threshold voltage is not smaller than the transition read voltage $V(i)_2$) is the storage state SM2. Further, according to the voltage value of the transition read voltage $V(i)_6$ corresponding to the target storage states SM2 and SM3 and the voltage value of the transition read voltage $V(i)_4$ of the lower physical page, the distinguishing code management circuit 2151 can identify that the storage state of the lower physical page of the plurality of memory cells, where the voltage value of the threshold voltage is not smaller than the voltage value of the transition read voltage $V(i)_4$, among all the memory cells of the target wordline is the storage state SL2, and the storage state of some memory cells, where the voltage value of the threshold voltage is smaller than the voltage value of the transition read voltage $V(i)_6$, among the memory cells having the storage state SL2 is the storage state SM2, and the storage state of the rest of memory cells (i.e., another remaining portion of memory cells of the memory cells where the voltage value of the threshold voltage is not smaller than the transition read voltage $V(i)_6$) is the storage state SM3.

Briefly, for the plurality of memory cells where the threshold voltage is smaller than the transition read voltage $V(i)_4$ and smaller than the transition read voltage $V(i)_2$, of which the bit value set of the storage state can be obtained by the distinguishing code management circuit 2151 by adding the storage state SL1 ("1") of the lower physical page to the storage state SM1 ("1") of the middle physical page, that is, the obtained byte of the storage state is "11" (also known as adjusted bits values set). For the plurality of memory cells where the threshold voltage is smaller than the transition read voltage $V(i)_4$ and not smaller than the transition read voltage $V(i)_2$, of which the bit value set of the storage state may be obtained by adding the storage state SL1 ("1") of the lower physical page to the storage state SM2 ("0") of the middle physical page, that is, the obtained byte of the storage state is "10". For the plurality of memory cells where the threshold voltage is not smaller than the transition read voltage $V(i)_4$ and smaller than the transition read voltage $V(i)_6$, of which the bit value set of the storage state may be obtained by adding the storage state SL2 ("0") of the lower physical page to the storage state SM2 ("0") of the middle physical page, that is, the obtained byte of the storage state is "00". For the plurality of memory cells where the threshold voltage is not smaller than the transition read voltage $V(i)_4$ and not smaller than the transition read voltage $V(i)_6$, of which the bit value set of the storage state may be obtained by adding the storage state SL2 ("0") of the lower physical page to the storage state SM3 ("1") of the middle physical page, that is, the obtained byte of the storage state is "01".

In other words, by adding the plurality of storage states SL1 and SL2 of the lower physical page to the current target storage states SM1, SM2, SM3 (as indicated by arrow A61) according to the voltage value of the transition read voltage of the lower physical page, the distinguishing code management circuit 2151 can change the plurality of target storage states SM1, SM2, SM3 and SML3 respectively having the current byte "1", "0", "1" into the target storage states SLM1, SLM2, SLM3 and SLM4 having the adjusted bits values sets "11", "10", "00" and "01". Specifically, the total number (i.e., 4) of the adjusted bits values sets "11", "10", "00", "01" is greater than the total number (i.e., 3) of the bit value sets "1", "0", "1", and the total number (i.e., 2) of bit values (also referred to as "the bit amount") of each of the adjusted bits values sets "11", "10", "00", "01" is greater than the total number (i.e., 1) of bit value (also referred to as "the bit amount") of each of the plurality of bit value sets "1", "0", "1".

After obtaining the changed plurality of target storage states SLM1, SLM2, SLM3, SLM4 (the current bit value sets of the plurality of target storage states SLM1, SLM2, SLM3, SLM4 are "11", "10", "00", "01"), the process flow proceeds to step S45. On this occasion, the distinguishing code management circuit 2151 determines that the plurality of target storage states SLM1, SLM2, SLM3, and SLM4 are all different (step S45→Yes). Next, in step S48, the distinguishing code management circuit 2151 sets the plurality of bit value sets "11", "10", "00", "01" of the plurality of target storage states SLM1, SLM2, SLM3, SLM4 to a plurality of distinguishing code patterns MSM1, MSM2, MSM3, MSM4 (shown by arrow A62) corresponding to the middle physical page, thereby completing the distinguishing code pattern setting operation corresponding to the middle physical page. In this example, the distinguishing code patterns MSM1 and MSM2 of the middle physical page constitute the distinguishing code set MSMS1 of the middle physical page, and the constituted distinguishing code set MSMS1 of the middle physical page corresponds to a transition read voltage TRV_MSMS1, $V(i)_2$. The distinguishing code patterns MSM3 and MSM4 of the middle physical page constitute a distinguishing code set MSMS2 of the middle physical page, and the constituted distinguishing code set MSMS2 of the middle physical page corresponds to a transition read voltage TRV_MSMS2, $V(i)_6$. In addition, a plurality of memory cells belonging to two adjacent distinguishing code sets MSMS1 and MSMS2 of the middle physical page may be divided according to the first candidate transition read voltage $V(i)_4$, and the distinguishing code management circuit 2151 can identify the first candidate transition read voltage $V(i)_4$ as the dividing read voltage SRV_MSMS$_{1\_2}$, $V(i)_4$ of the distinguishing code sets MSMS1 and MSMS2 of the middle physical page. That is, the plurality of distinguishing code patterns MSM1, MSM2, MSM3, and MSM4 corresponding to the target physical page (middle physical page) may correspond to the dividing read voltage SRV_MSMS$_{1\_2}$, V(i)$_4$.

It should be noted that, in this embodiment, the dividing read voltages corresponding to the plurality of distinguishing code patterns of the target physical page are marked in the figure by a double arrow, and the transition read voltage corresponding to the plurality of distinguishing codes of the target physical page is marked in the figure by a single arrow.

Figure 7A:
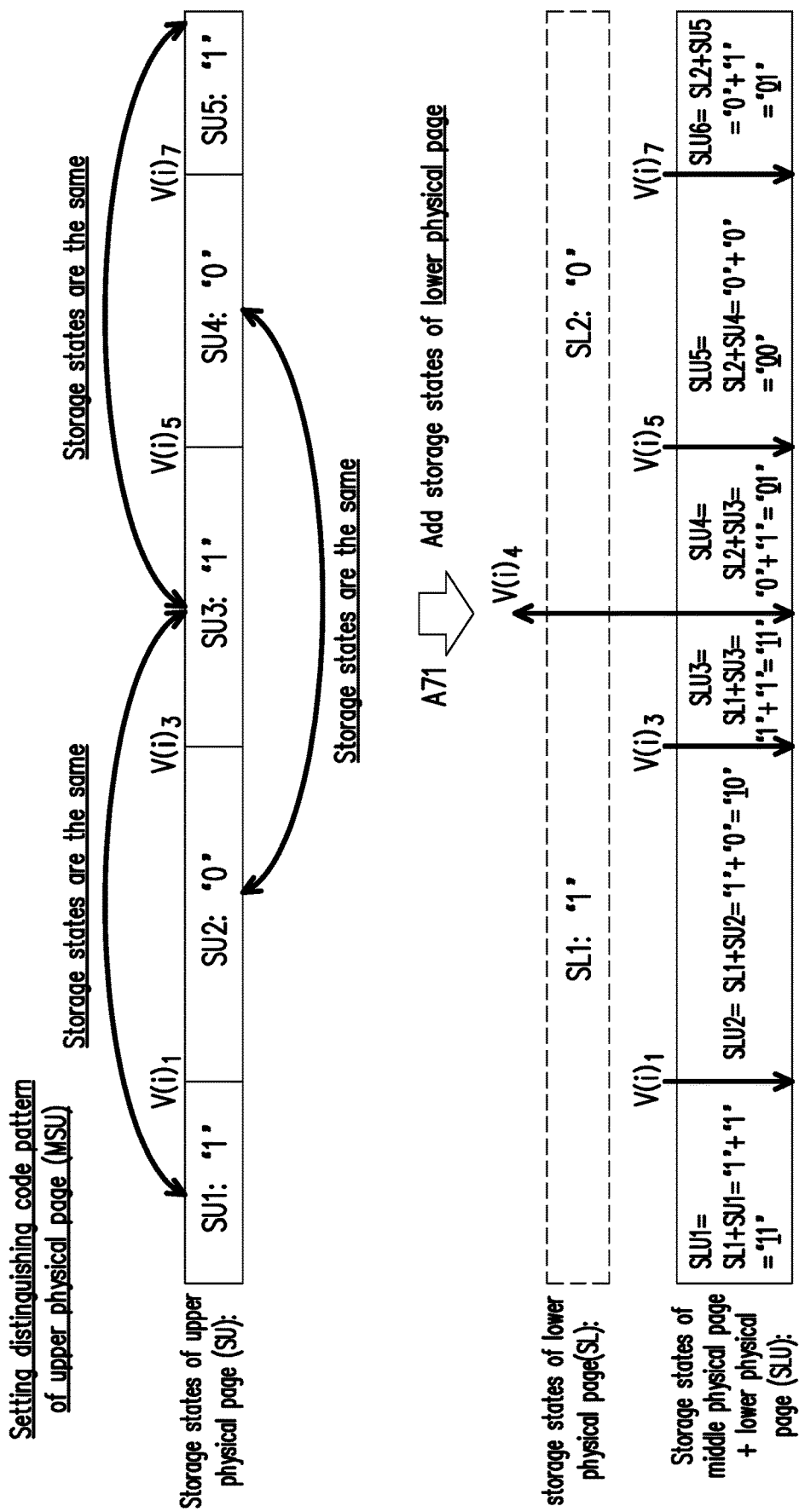
FIG. 7A, FIG. 7B, and FIG. 7C are schematic diagrams of setting a distinguishing code pattern of an upper physical page according to an embodiment of the present disclosure.
Figure 7B:
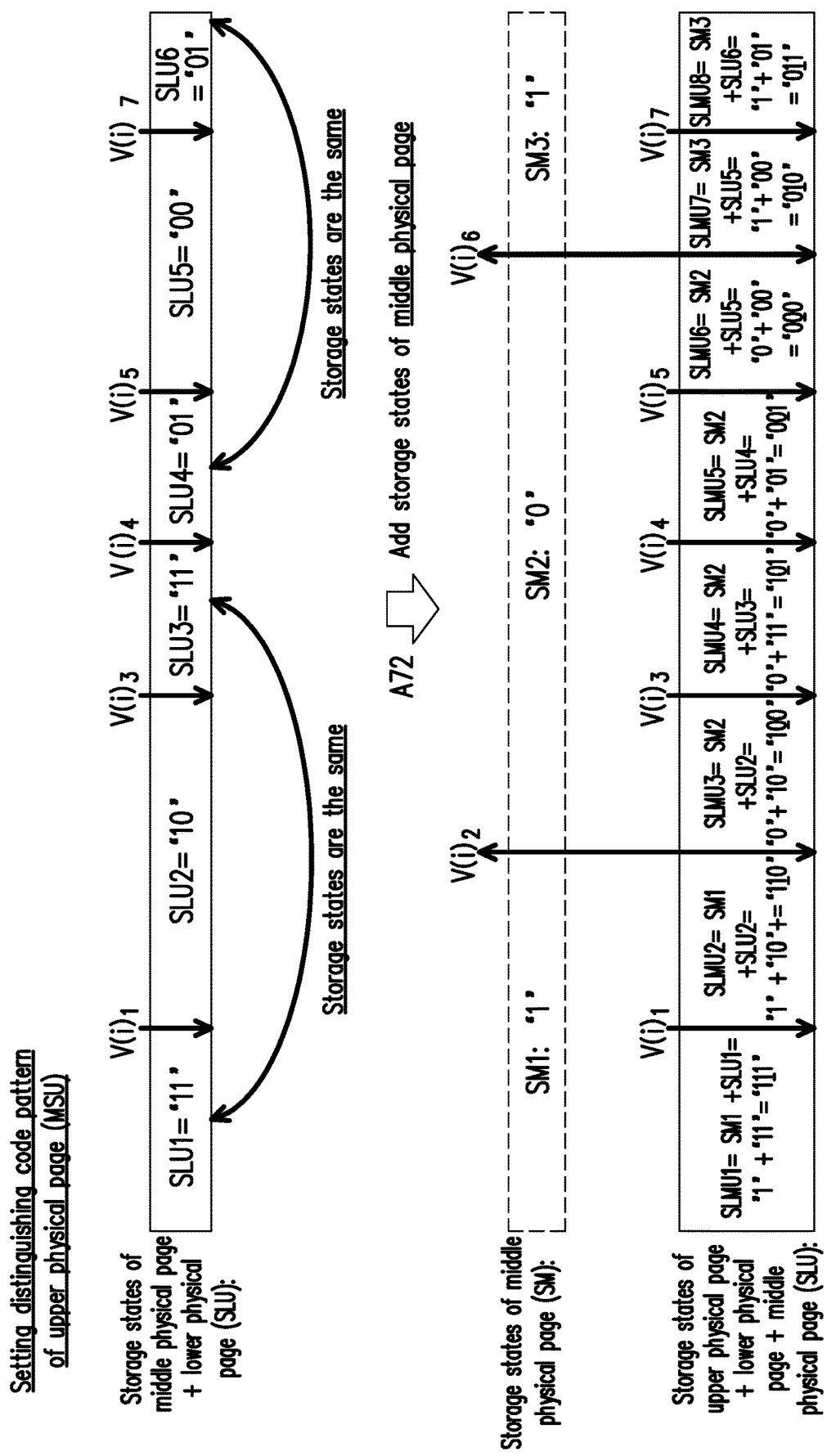
Figure 7C:
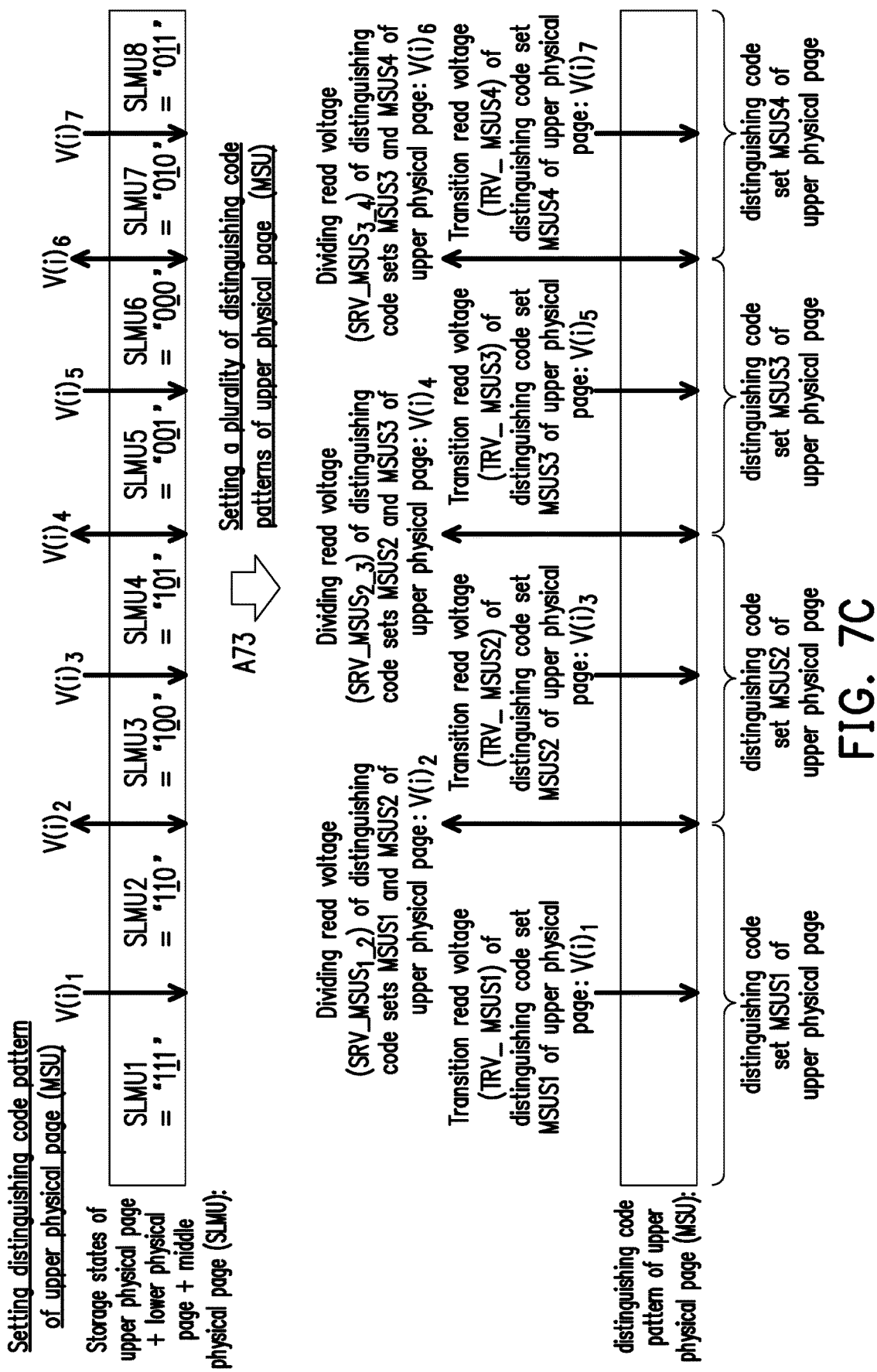

FIG. 7A, FIG. 7B, and FIG. 7C are schematic diagrams of setting a distinguishing code pattern of an upper physical page according to an embodiment of the present disclosure. Please refer to FIG. 7A. For example, it is assumed the selected target physical page is the upper physical page. The distinguishing code management circuit 2151 performs the distinguishing code pattern setting operation corresponding to the upper physical page. Specifically, the lower physical page and the middle physical page are regarded as candidate physical pages (S41). Then, the distinguishing code management circuit 2151 identifies four (Q=4) transition read voltages V(i)$_1$, V(i)$_3$, V(i)$_5$, V(i)$_7$ of the upper physical page according to the preset read voltage V(i)$_1$ (S32). As shown in FIG. 7A, the transition read voltages V(i)$_1$, V(i)$_3$, V(i)$_5$, V(i)$_7$ are configured to divide the five storage states SU1, SU2, SU3, SU4, SU5 (M=5) of the upper physical page. Then, the distinguishing code management circuit 2151 initially sets a plurality of target storage states SU1, SU2, SU3, SU4, SU5 according to the five storage states SU1, SU2, SU3, SU4, SU5 of the upper physical page. That is, the current plurality of target storage states are the storage state SU1 ("1"), the storage state SU2 ("0"), the storage state SU3 ("1"), the storage state SU4 ("0"), and the storage state SU5 ("1") (S33).

Next, the distinguishing code management circuit 2151 determines that the total number of transition read voltages V(i)$_1$, V(i)$_3$, V(i)$_5$, V(i)$_7$ of the upper physical page is not equal to 1 (4≠1) (step S44→No), and the distinguishing code management circuit 2151 then determines that the plurality of target storage states SU1, SU2, SU3, SU4, SU5 are not all different (step S35→No) (e.g., the target storage state SU1 is the same as the target storage states SU3 and SU5, and the target storage state SU2 is the same as the target storage state SU4). The process flow proceeds to step S46.

In step S46, the distinguishing code management circuit 2151 selects the first candidate physical page arranged first from one or more non-selected candidate physical pages of the plurality of candidate physical pages according to the physical page sequence. In this example, the plurality of candidate physical pages are the lower physical page and the middle physical page, wherein the lower physical page is arranged prior to the middle physical page. That is, the distinguishing code management circuit 2151 selects the lower physical page as the first candidate physical page, and identifies the plurality of storage states SL1 and SL2 of the lower physical page as the plurality of first candidate storage states. Specifically, the plurality of first candidate storage states SL1 and SL2 are divided by the transition read voltage V(i)$_4$. That is, the first candidate physical page corresponds to one first candidate transition read voltage V(i)$_4$.

In this embodiment, in the process of performing step S47, by adding the plurality of first candidate storage states SL1 and SL2 of the first candidate physical page to the current target storage states SU1, SU2, SU3, SU4, SU5 (as indicated by arrow A71), the distinguishing code management circuit 2151 can obtain the changed target storage states SLU1, SLU2, SLU3, SLU4, SLU5, SLU6 having the bit value sets "11", "10", "11", "01", "00", "01". It should be noted that the current target storage states SLU1, SLU2, SLU3, SLU4, SLU5, SLU6 correspond to one dividing read voltage V(i)$_4$ and four transition read voltages V(i)$_1$, V(i)$_3$, V(i)$_5$, V(i)$_7$.

Referring to FIG. 7B, after obtaining the changed plurality of target storage states SLU1, SLU2, SLU3, SLU4, SLU5, SLU6 (the current bit value sets of the plurality of target storage states SLU1, SLU2, SLU3, SLU4, SLU5, SLU6 are "11", "10", "11", "01", "00", "01"), and the process flow continues to step S45. On this occasion, the distinguishing code management circuit 2151 determines that the plurality of target storage states SLU1, SLU2, SLU3, SLU4, SLU5, and SLU6 are all different (step S45→No) (e.g., the target storage state SLU1 is the same as the target storage state SLU3, and the target storage state SLU4 is the same as the target storage state SLU6), and the process flow is continued to step S46.

In step S36, the distinguishing code management circuit 2151 selects the first candidate physical page arranged first from one or more non-selected candidate physical pages of the plurality of candidate physical pages according to the physical page sequence. On this occasion, the remaining candidate physical page of the plurality of candidate physical pages that has not been selected is the middle physical page (the lower physical page of the plurality of candidate physical pages has been selected in the previous step S36), the middle physical page is the current first candidate physical page arranged first. That is, the distinguishing code management circuit 2151 selects the middle physical page as the first candidate physical page, and identifies the plurality of storage states SM1, SM2, SM3 of the middle physical page as the plurality of first candidate storage states. Specifically, the plurality of first candidate storage states SM1, SM2, SM3 are divided by the transition read voltages V(i)$_2$ and V(i)$_6$. That is, the first candidate physical page corresponds to two first candidate transition read voltages V(i)$_2$ and V(i)$_6$.

In this embodiment, in the process of performing step S47, by adding the plurality of first candidate storages states SM1, SM2, SM3 of the first candidate physical page (middle physical page) to the current target storage states SLU1, SLU2, SLU3, SLU4, SLU5, SLU6 (as indicated by arrow A72), the distinguishing code management circuit 2151 can obtain the changed plurality of target storage states SLMU1, SLMU2, SLMU3, SLMU4, SLMU5, SLMU6, SLMU7, SLMU8 having the bit value sets "111", "110", "100", "101", "001", "000", "010", "011". It should be noted that the current target storage states SLMU1, SLMU2, SLMU3, SLMU4, SLMU5, SLMU6, SLMU7, SLMU8 correspond to three dividing read voltages V(i)$_2$, V(i)$_4$, V(i)$_6$ and 4 transition read voltages V(i)$_1$, V(i)$_3$, V(i)$_5$, V(i)$_7$.

After obtaining the changed plurality of target storage states SLMU1, SLMU2, SLMU3, SLMU4, SLMU5, SLMU6, SLMU7, SLMU8 (the current bit value sets of the plurality of target storage states SLMU1, SLMU2, SLMU3, SLMU4, SLMU5, SLMU6, SLMU7, SLMU8 are "111", "110", "100", "101", "001", "000", "010", "011"), and the process flow is continued to step S45. On this occasion, the distinguishing code management circuit 2151 determines that the plurality of target storage states SLMU1, SLMU2, SLMU3, SLMU4, SLMU5, SLMU6, SLMU7, SLMU8 are all different (step S45→YES), and the process flow continues to step S48.

Referring to FIG. 7C, next, in step S48, the distinguishing code management circuit 2151 sets the plurality of bit value sets "111", "110", "100", "101", "001", "000", "010", "011" of the plurality of target storage states SLMU1, SLMU2, SLMU3, SLMU4, SLMU5, SLMU6, SLMU7, SLMU8 to a plurality of distinguishing code patterns MSU1, MSU2, MSU3, MSU4, MSU5, MSU6, MSU7, MSU8 (as indicated by arrow A73) corresponding to the upper physical page, thereby completing the distinguishing code pattern setting operation corresponding to the upper physical page.

In this example, the distinguishing code patterns MSU1 and MSU2 of the upper physical page constitute the distinguishing code set MSUS1 of the upper physical page, and the constituted distinguishing code set MSUS1 of the upper physical page corresponds to a transition read voltage TRV_MSUS1, $V(i)_1$. The distinguishing code patterns MSU3 and MSU4 of the upper physical page constitute the distinguishing code set MSUS2 of the upper physical page, and the constituted distinguishing code set MSUS2 of the upper physical page corresponds to a transition read voltage TRV_MSUS2, $V(i)_3$. The distinguishing code patterns MSU5 and MSU6 of the upper physical page constitute the distinguishing code set MSUS3 of the upper physical page, and the constituted the distinguishing code set MSUS3 of the upper physical page corresponds to a transition read voltage TRV_MSUS3, $V(i)_5$. The distinguishing code patterns MSU7 and MSU8 of the upper physical page constitute the distinguishing code set MSUS4 of the upper physical page, and the constituted distinguishing code set MSUS4 of the upper physical page corresponds to a transition read voltage TRV_MSUS4, $V(i)_7$.

In addition, a plurality of memory cells belonging to the two adjacent distinguishing code sets MSUS1 and MSUS2 of the upper physical page can be divided according to the first candidate transition read voltage $V(i)_2$, and the distinguishing code management circuit 2151 can identify the first candidate transition read voltage $V(i)_2$ as the dividing read voltage SRV_MSUS1_2, $V(i)_2$ of the distinguishing code sets MSUS1 and MSUS2 the upper physical page. That is to say, the plurality of distinguishing code patterns MSU1, MSU2, MSU3, MSU4 corresponding to the target physical page (middle physical page) may correspond to the dividing read voltage SRV_MSUS$_{1\_2}$, $V(i)_2$.

The plurality of memory cells belonging to the two adjacent distinguishing code sets MSUS3 and MSUS4 of the upper physical page can be divided according to the first candidate transition read voltage $V(i)_6$, and distinguishing code management circuit 2151 can identify the first candidate transition read voltage $V(i)_6$ as the dividing read voltage SRV_MSUS$_{3\_4}$, $V(i)_6$ of the distinguishing code sets MSUS3 and MSUS4 of the upper physical page. That is to say, the plurality of distinguishing code patterns MSU5, MSU6, MSU7, MSU8 corresponding to the target physical page (middle physical page) can correspond to the divided read voltage SRV_MSUS$_{3\_4}$, $V(i)_6$.

The plurality of memory cells belonging to the two adjacent distinguishing code sets MSUS2 and MSUS3 of the upper physical page may be divided according to the previous (FIG. 7A) first candidate transition read voltage $V(i)_4$, and the distinguishing code management circuit 2151 can identify the first candidate transition read voltage $V(i)_2$ is the divided read voltage SRV_MSUS$_{2\_3}$, $V(i)_4$ of the distinguishing code sets MSUS2 and MSUS3 of the upper physical page. That is to say, the plurality of distinguishing code patterns MSU3, MSU4, MSU5, MSU6 corresponding to the target physical page (middle physical page) can correspond to the divided read voltage SRV_MSUS$_{2\_3}$, $V(i)_4$.

FIG. 8A is a schematic diagram of setting a distinguishing code pattern corresponding to a first read voltage mode according to an embodiment of the disclosure. FIG. 8B is a schematic diagram of setting a distinguishing code pattern corresponding to a second read voltage mode according to an embodiment of the disclosure. Referring to FIG. 8A, after the distinguishing code pattern setting operation is performed for all physical pages of the rewritable non-volatile memory module 220 having the first read voltage mode (1/2/4), as shown by the arrow A81, the distinguishing code management circuit 2151 can obtain and record two distinguishing code patterns MSL1 and MSL2 corresponding to the lower physical page, and the two distinguishing code patterns MSL1 and MSL2 correspond to the transition read voltage $V(i)_4$; four distinguishing code patterns MSM1, MSM2, MSM3, MSM4 corresponding to the middle physical page, and the four distinguishing code patterns MSM1, MSM2, MSM3, MSM4 correspond to the transition read voltage $V(i)_2$ and $V(i)_6$ and the dividing read voltage $V(i)_4$; eight distinguishing code patterns MSU1, MSU2, MSU3, MSU4, MSU5, MSU6, MSU7, MSU8 corresponding to the upper physical page, and the eight distinguishing code patterns MSU1, MSU2, MSU3, MSU4, MSU5, MSU6, MSU7, MSU8 correspond to the transition read voltage $V(i)_1$, $V(i)_3$, $V(i)_5$, $V(i)_7$ and dividing read voltage $V(i)_4$, $V(i)_2$, $V(i)_6$. It should be noted that after fixing (not adjusting) the applied dividing read voltages corresponding to the physical pages, the total number of memory cells respectively corresponding to the distinguishing code patterns MSL1 and MSL2 can be changed through adjusting the applied transition read voltage $V(i)_4$; the total number of memory cells respectively corresponding to the distinguishing code patterns MSM1 and MSM2 can be changed through adjusting the applied transition read voltage $V(i)_2$; the total number of memory cells respectively corresponding to the distinguishing code patterns MSM3 and MSM4 can be changed through adjusting the applied transition read voltage $V(i)_6$; the total number of memory cells respectively corresponding to the distinguishing code patterns MSU1 and MSU2 can be changed through adjusting the applied transition read voltage $V(i)_1$; the total number of memory cells respectively corresponding to the distinguishing code patterns MSU3 and MSU4 can be changed through adjusting the applied transition read voltage $V(i)_3$; the total number of memory cells respectively corresponding to the distinguishing code patterns MSU5 and MSU6 can be changed through adjusting the applied transition read voltage $V(i)_5$; the total number of memory cells respectively corresponding to the distinguishing code patterns MSU7 and MSU9 can be changed through adjusting the applied transition read voltage $V(i)_7$.

It should be noted that, in the example, the sum of the total number of memory cells corresponding to the test code MSM1 and the total number of memory cells corresponding to the test code MSM2 is equal to the total number of memory cells corresponding to the test code MSL1. Therefore, the applied dividing read voltage $V(1)_4$ needs to be fixed (not adjusted). That is, by fixing the voltage value of the applied dividing read voltage $V(1)_4$, the total number of memory cells corresponding to the test code MSL1 and the total number of memory cells corresponding to the test code MSL2 are fixed, so that the sum of the total number of memory cells corresponding to the test code MSM1 and the total number of memory cells corresponding to the test code MSM2 is fixed (equal to the fixed total number of memory cells corresponding to the test code MSL1) and the sum of the total number of memory cells corresponding to the test code MSM3 and the total number of memory cells corresponding to the test code MSM4 is fixed (equal to the fixed total number of memory cells corresponding to the test code MSL2). In this way, the adjusted transition read voltage $V(1)_2$ does not affect the sum of the total number of memory cells corresponding to the test code MSM3 and the total number of memory cells corresponding to the test code MSM4 (the total number of the memory cells corresponding to the test code MSL2 is fixed), and the adjusted transition read voltage $V(1)_6$ does not affect the sum of the total number of memory cells corresponding to the test code MSM1 and the total number of memory cells corresponding to the test code MSM2 (the total number of memory cells corresponding to the test code MSL1 is fixed). Because of this, the read voltage $V(1)_4$ is also referred to as the "dividing" read voltage (because the dividing read voltage is configured to divide the sum of the memory cells on the left and right sides corresponding to different test codes).

In the same manner, please refer to FIG. 8B, after performing the distinguishing code pattern setting operation for all physical pages of the rewritable non-volatile memory module 220 having the first read voltage mode (2/3/2), as shown by the arrow A82, the distinguishing code management circuit 2151 can obtain and record the eight distinguishing code patterns MSL1, MSL2, MSL3, MSL4, MSL5, MSL6, MSL7, MSL8 (having a bit value set "111", "011", "001", "000", "010", "110", "100", "101", respectively) corresponding to the lower physical page, and the eight distinguishing code patterns MSL1, MSL2, MSL3, MSL4, MSL5, MSL6, MSL7, MSL8 correspond to the transition read voltages $V(i)_1$ and $V(i)_5$ and the dividing read voltages $V(i)_2$, $V(i)_3$, $V(i)_4$, $V(i)_6$, $V(i)_7$; eight distinguishing code patterns MSM1, MSM2, MSM3, MSM4, MSM5, MSM6, MSM7, MSM8 (having a bit value set "111", "011", "001", "000", "010", "110", "100", "101", respectively) corresponding to the middle physical page, and the eight distinguishing code patterns MSM1, MSM2, MSM3, MSM4, MSM5, MSM6, MSM7, MSM8 correspond to the transition read voltages $V(i)_2$ and $V(i)_6$ and the dividing read voltages $V(i)_1$, $V(i)_3$, $V(i)_4$, $V(i)_5$, $V(i)_7$; the eight distinguishing code patterns MSU1, MSU2, MSU3, MSU4, MSU5, MSU6, MSU7, MSU8 (having a bit value set "111", "011", "001", "000", "010", "110", "100", "101", respectively) corresponding to the upper physical page, and the eight distinguishing code patterns MSU1, MSU2, MSU3, MSU4, MSU5, MSU6, MSU7, MSU8 correspond to the transition read voltages $V(i)_3$ and $V(i)_7$ and the dividing read voltages $V(i)_1$, $V(i)_2$, $V(i)_4$, $V(i)_5$, $V(i)_6$.

It should be noted that after fixing the applied dividing read voltages corresponding to the physical pages, the total number of memory cells respectively corresponding to the distinguishing code patterns MSL1 and MSL2 can be changed by adjusting the applied transition read voltage $V(i)_1$; the total number of memory cells respectively corresponding to the distinguishing code patterns MSL5 and MSL6 can be changed by adjusting the applied transition read voltage $V(i)_5$; the total number of memory cells respectively corresponding to the distinguishing code patterns MSM2 and MSM3 can be changed by adjusting the applied transition read voltage $V(i)_2$; the total number of memory cells respectively corresponding to the distinguishing code patterns MSM6 and MSM7 can be changed by adjusting the applied transition read voltage $V(i)_6$; the total number of memory cells respectively corresponding to the distinguishing code patterns MSU3 and MSU4 can be changed by adjusting the applied transition read voltage $V(i)_3$; the total number of memory cells respectively corresponding to the distinguishing code patterns MSU7 and MSU8 can be changed by adjusting the applied transition read voltage $V(i)_7$.

Returning to FIG. 4, in step S50, the distinguishing code management circuit 2151 can determine whether the total number of the Q transition read voltages is greater than a predetermined threshold. In response to determining that the total number of the Q transition read voltages is not greater than the predetermined threshold, proceeding to step S45; in response to determining that the total number of the Q transition read voltages is greater than the predetermined threshold, proceeding to step S51. The predetermined threshold is determined according to the read voltage mode of the rewritable non-volatile memory module 220. In this embodiment, for the rewritable non-volatile memory module 220 having the first read voltage mode (1/2/4), the predetermined threshold may be set to 3.

In step S51, the distinguishing code management circuit 2151 directly sets a plurality of gray codes of the memory cell as a plurality of distinguishing code patterns corresponding to the target physical page to complete the distinguishing code pattern setting operation corresponding to the target physical page.

For example, it is assumed that the target physical page is an upper physical page, and the upper physical page corresponds to four transition read voltages. Since the total number (i.e., Q) of the plurality of transition read voltages corresponding to the upper physical page is greater than 3, the distinguishing code management circuit 2151 directly uses (as shown in FIG. 4) corresponding gray codes "111", "110", "100", "101", "001", "000", "010" and "011" as the plurality of distinguishing code patterns MSU1, MSU2, MSU3, MSU4, MSU5, MSU6, MSU7, MSU8 corresponding to the upper physical page.

Please return to FIG. 3, after the distinguishing code management circuit 2151 identifies the plurality of distinguishing code patterns corresponding to the target physical page and the plurality of corresponding transition read voltages (e.g., through looking up the plurality of distinguishing code patterns and the plurality of corresponding transition read voltages recorded by the completed distinguishing code pattern setting operation), in step S33, the enhanced read circuit 2152 reads the target physical page by using the Q transition read voltages, thereby obtaining the distinguishing codes of each of the plurality of target memory cells of the target physical page.

Next, in step S34, the enhanced read circuit 2152 reads the target physical page by using the Q assisting read voltage sets corresponding to the Q transition read voltages to obtain the assisting bit values of each of the plurality of target memory cells of the target physical page. Specifically, for the j-th assisting read voltage set corresponding to the j-th transition read voltage among the Q transition read voltages in the Q assisting read voltage sets, the read assisting circuit unit reads the target physical page by using the left assisting read voltage of the j-th assisting read voltage set to obtain the left assisting bit value of each of the plurality of target memory cells, wherein the read assisting circuit unit reads the target physical page by using the right assisting read voltage of the j-th assisting read voltage set to obtain the right assisting bit value of each of the plurality of target memory cells. Finally, the read assisting circuit unit calculates the left assisting bit value and the right assisting bit value of each of the plurality of target memory cells through the XOR operation or the XNOR operation, and the obtained first operation result corresponding to the XOR operation or a second operation result corresponding to the XNOR operation is used as the assisting bit value of each of the plurality of target memory cells. j is a positive integer smaller than or equal to Q.

Figure 9A:
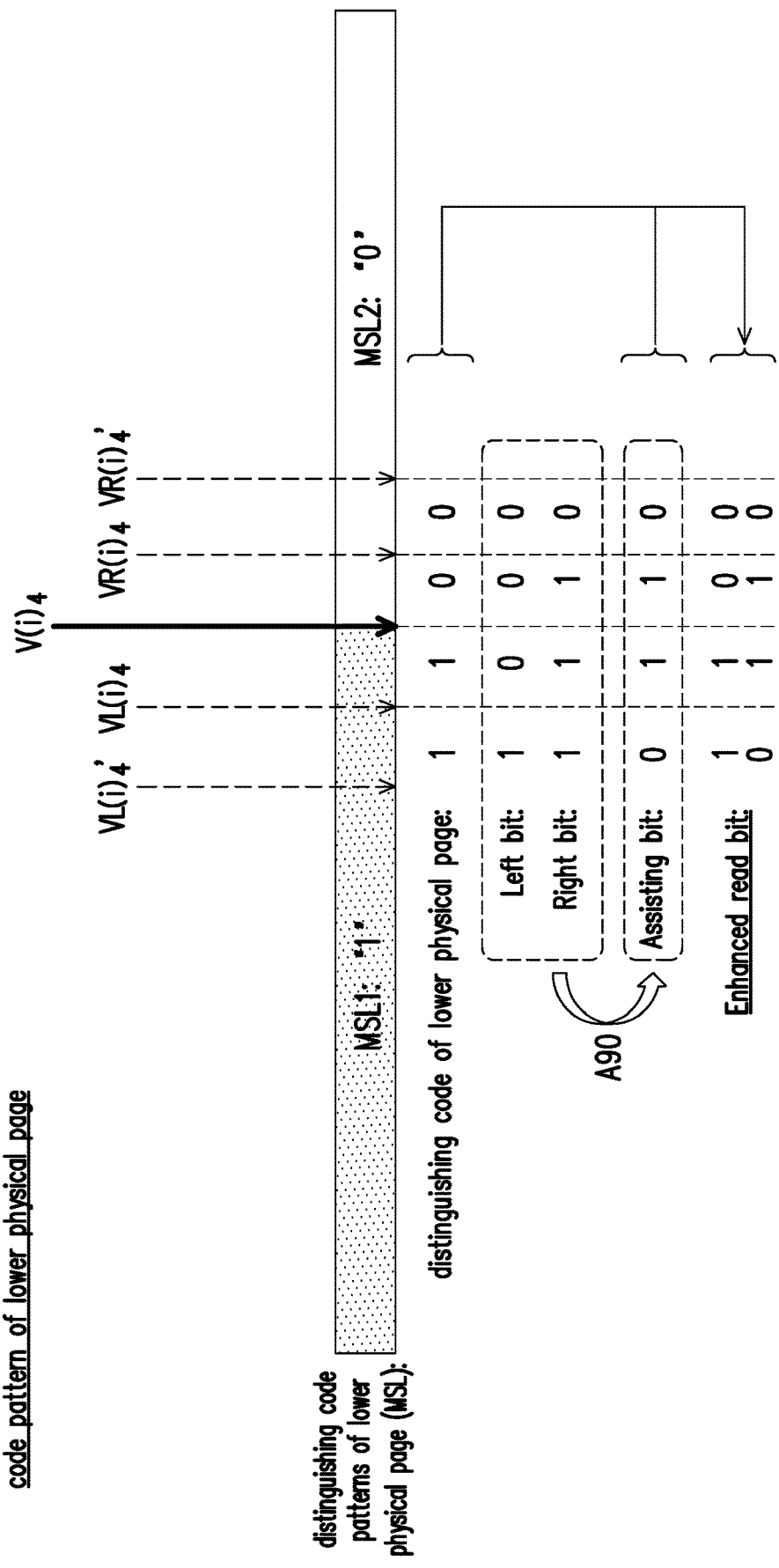
FIG. 9A is a schematic diagram of enhanced read bit values generated according to a distinguishing code pattern of a lower physical page according to an embodiment of the disclosure.
Figure 9B:
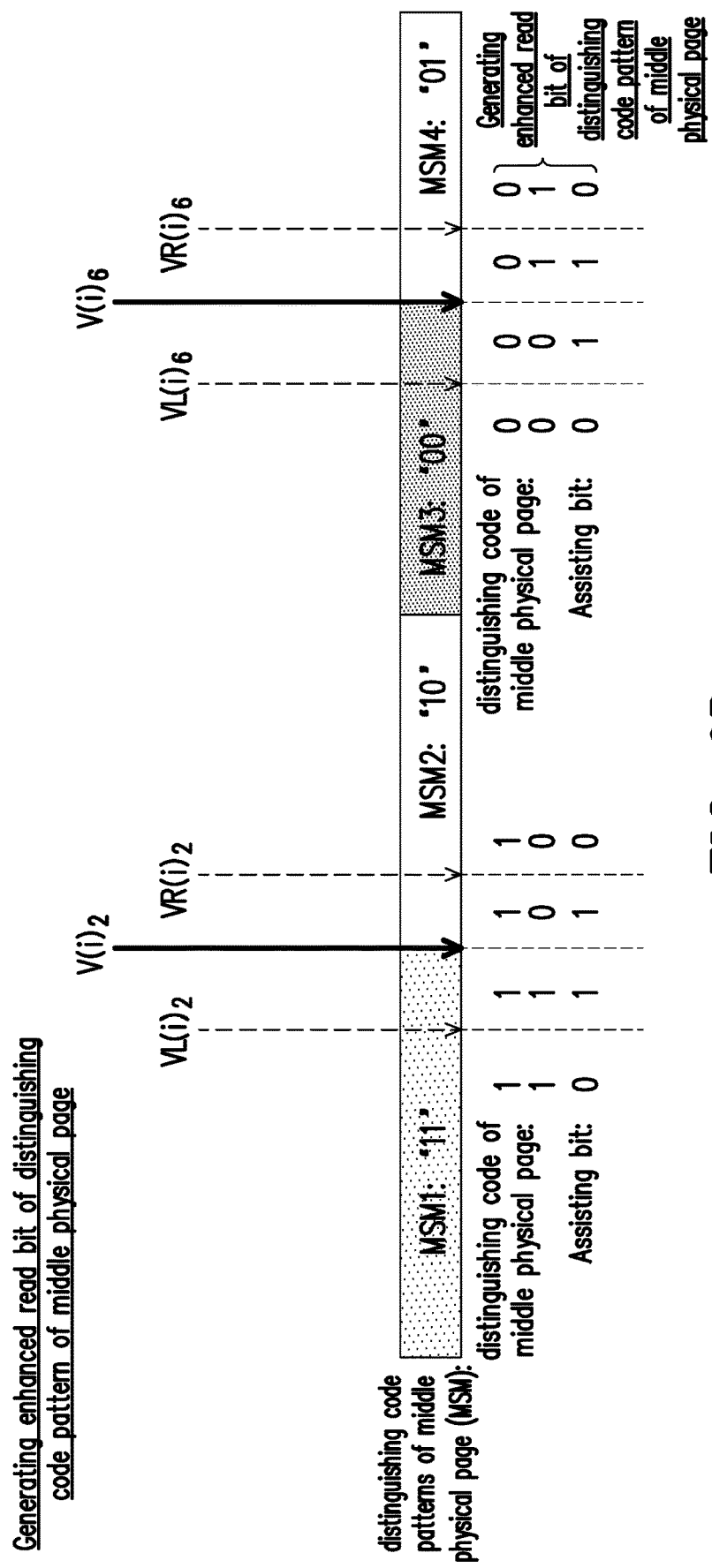
FIG. 9B is a schematic diagram of enhanced read bit values generated according to a distinguishing code pattern of a middle physical page according to an embodiment of the disclosure.
Figure 9C:
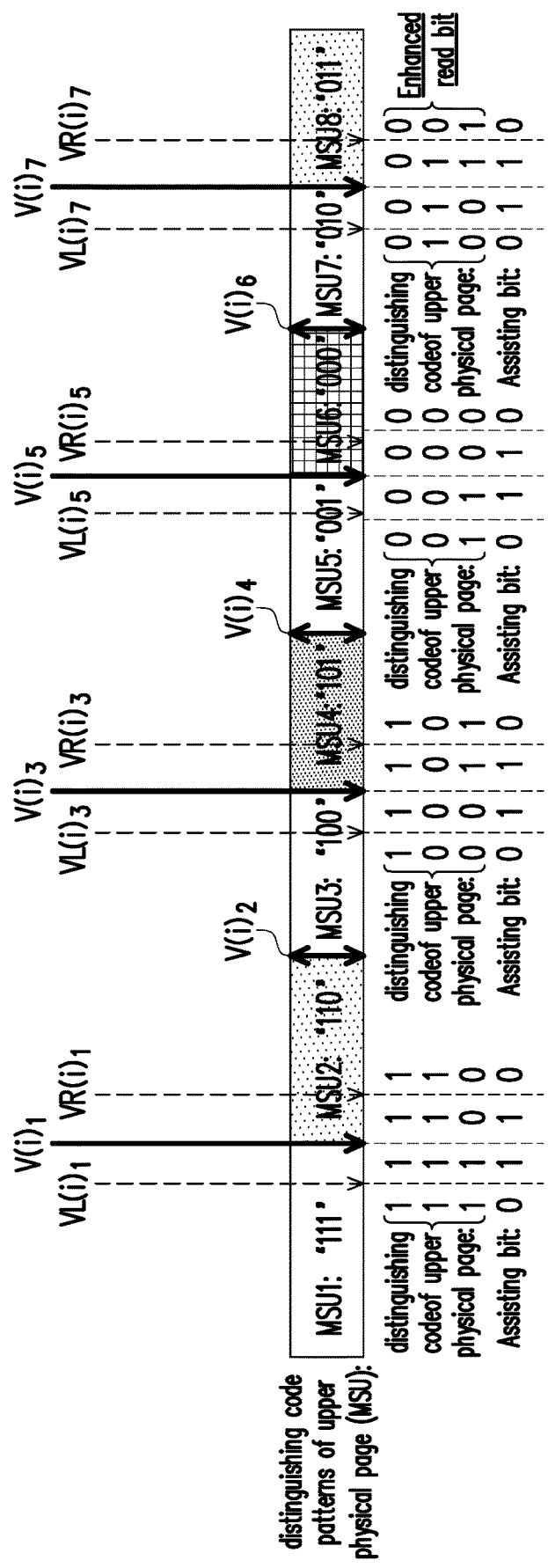
FIG. 9C is a schematic diagram of enhanced read bit values generated according to a distinguishing code pattern of an upper physical page according to an embodiment of the disclosure.

Next, in step S35, the enhanced read circuit 2152 combines the distinguishing code and the assisting bit value of each of the plurality of target memory cells to obtain the enhanced read bit value of each of the plurality of target memory cells. FIG. 9A-FIG. 9C are illustrated for description.

FIG. 9A is a schematic diagram of enhanced read bit values generated according to a distinguishing code pattern of a lower physical page according to an embodiment of the disclosure. Referring to FIG. 9A, for example, it is assumed that the target physical page is the lower physical page, and the distinguishing code management circuit 2151 has identified the distinguishing code pattern MSL1 "1" and the distinguishing code pattern MSL2 "0" corresponding to the lower physical page and the corresponding transition read voltage $V(i)_4$.

For the distinguishing code patterns MSL1 and MSL2 of the lower physical page, the enhanced read circuit 2152 can read the plurality of memory cells of the lower physical page by using the corresponding transition read voltage $V(i)_4$ to obtain a distinguishing code of a plurality of memory cells corresponding to the lower physical page (step S33) (for example, the distinguishing code "1 1 0 0" of the lower physical page shown in FIG. 9A). It should be noted that the distinguishing code "1 1 0 0" of the lower physical page in this example only represents the bit values (arranged from small to large according to magnitude of voltage) of the distinguishing codes of the memory cells in different plurality of threshold voltage distribution regions divided by different read voltages, and does not represent that all the memory cells of the lower physical page only record four bit values "1 1 0 0".

In the present embodiment, the enhanced read circuit 2152 can generate an assisting read voltage set corresponding to the transition read voltage $V(i)_4$ according to the transition read voltage $V(i)_4$, wherein the assisting read voltage set includes assisting read voltage $VL(i)_4$ and assisting read voltage $VR(i)_4$. The voltage value of the left assisting read voltage of the assisting read voltage set corresponding to the transition read voltage $V(i)_4$ is the voltage value of the transition read voltage $V(i)_4$ minus a first preset voltage offset, wherein the voltage value of the right assisting read voltage of the assisting read voltage set corresponding to the transition read voltage $V(i)_4$ is the voltage value of the transition read voltage $V(i)_4$ plus a second preset voltage offset. The first preset voltage offset and the second preset voltage offset may be equal to each other.

Next, the enhanced read circuit 2152 can respectively read the plurality of memory cells of the lower physical page by using the assisting read voltage $VL(i)_4$ and the assisting read voltage $VR(i)_4$ corresponding to the transition read voltage $V(i)_4$ to obtain the corresponding left bit value (also known as a left assisting bit) and the right bit value (also known as a right assisting bit) (e.g., the left bit "1 0 0 0" and the right bit "1 1 1 0" shown in FIG. 9A, and then calculate the obtained left bit value and the right bit value through the XOR operation to obtain the corresponding assisting bit "0 1 1 0" (such as denoted by an arrow A90)) (step S34). Finally, the enhanced read circuit 2152 can combine the distinguishing code "1 1 0 0" of the lower physical page and the corresponding assisting bit value "0 1 1 0" to form an enhanced read bit value "10 11 01 00".

FIG. 9B is a schematic diagram of enhanced read bit values generated according to a distinguishing code pattern of a middle physical page according to an embodiment of the disclosure. Referring to FIG. 9B, for example, it is assumed that the target physical page is a middle physical page, and the distinguishing code management circuit 2151 has identified the distinguishing code pattern MSM1 "11", the distinguishing code pattern MSM2 "10", the distinguishing code pattern MSM3 "00" and the distinguishing code pattern MSM4 "01" corresponding to the middle physical page, the corresponding transition read voltages $V(i)_2$ and $V(i)_6$, and the corresponding dividing read voltage $V(i)_4$.

For the distinguishing code patterns MSM1 and MSM2 of the middle physical page on the left of the dividing read voltage $V(i)_4$, the enhanced read circuit 2152 can read a plurality of memory cells of the middle physical page by using the dividing read voltage $V(i)_4$ and the corresponding transition read voltage $V(i)_2$ to obtain the distinguishing codes of a plurality of memory cells of the corresponding middle physical page (step S33) (For example, the distinguishing code "11 11 10 10" of the middle physical page in FIG. 9B). Then, the enhanced read circuit 2152 can read the plurality of memory cells of the middle physical page respectively by using the assisting read voltage $VL(i)_2$ and the assisting read voltage $VR(i)_2$ corresponding to the transition read voltage $V(i)_2$ to obtain a corresponding assisting bit "0 1 1 0" (step S34). Finally, the enhanced read circuit 2152 can combine the distinguishing code "11 11 10 10" of the middle physical page and the corresponding assisting bit value "0 1 1 0" to form an enhanced read bit value "110 111 101 100".

Similarly, for the distinguishing code patterns MSM3 and MSM4 of the middle physical page on the right of the dividing read voltage $V(i)_4$, the enhanced read circuit 2152 can read the plurality of memory cells of the middle physical page by using the dividing read voltage $V(i)_4$ and the corresponding transition read voltage $V(i)_6$ to obtain the distinguishing codes of the plurality of memory cells of the corresponding middle physical page (step S33) (for example, the distinguishing codes "00 00 01 01" of the middle physical page shown in FIG. 9B). Next, the enhanced read circuit 2152 can read the plurality of memory cells of the middle physical page respectively by using the assisting read voltage $VL(i)_6$ and the assisting read voltage $VR(i)_6$ corresponding to the transition read voltage $V(i)_6$ to obtain a corresponding assisting bit "0 1 1 0" (step S34). Finally, the enhanced read circuit 2152 can combine the distinguishing codes "00 00 01 01" of the middle physical page and the corresponding assisting bit value "0 1 1 0" to form an enhanced read bit value "000 001 011 010".

It should be that in the example of FIG. 9B, there are no two identical bit pairs in the plurality of bit pairs of the formed enhanced read bit value "110 111 101 100" and the enhanced read bit value "000 001 011 010". That is, the processor 211 or the error checking and correcting circuit 214 can know the distinguishing code pattern to which each of the plurality of bit pairs in the enhanced read bit value "110 111 101 100" and the enhanced read bit value "000 001 011 010" belongs, the corresponding transition read voltage and corresponding reliability through the plurality of bit pairs of the enhanced read bit value "110 111 101 100" and the enhanced read bit value "000 001 011 010". For example, the processor 211 or the error checking and correcting circuit 214 can identify that: the bit pair "110" and the bit pair "111" in the enhanced read bit value "110 111 101 100" both correspond to the distinguishing code pattern MSM1 "11", and the bit pair "110" has higher reliability than the bit pair "111"; the bit pair "101" and the bit pair "100" in the enhanced bit value "110 111 101 100" both correspond to the distinguishing code pattern MSM2 "10", and the bit pair "100" has higher reliability than the bit pair "101"; the bit pair "000" and the bit pair "001" in the enhanced read bit value "000 001 011 010" both correspond to the distinguishing code pattern MSM3 "00", and the bit pair "000" has higher reliability than the bit pair "001"; the bit pair "011" and the bit pair "010" in the enhanced read bit value "000 001 011 010" both correspond to the distinguishing code pattern MSM4 "01", and the bit pair "010" has higher reliability than the bit pair "011".

FIG. 9C is a schematic diagram of enhanced read bit values generated according to a distinguishing code pattern of an upper physical page according to an embodiment of the disclosure. Referring to FIG. 9C, for example, it is assumed that the target physical page is the upper physical page, and the distinguishing code management circuit 2151 has identified the distinguishing code pattern MSU1"111", the distinguishing code pattern MSU2"110", the distinguishing code pattern MSU3"100", the distinguishing code pattern MSU4"101", the distinguishing code pattern MSU5"001", the distinguishing code pattern MSU6"000", the distinguishing code pattern MSU7"010", and the distinguishing code pattern MSU8"011" corresponding to the upper physical page, the corresponding transition read voltages $V(i)_1$, $V(i)_3$, $V(i)_5$, and $V(i)_7$, and the corresponding dividing read voltages $V(i)_4$, $V(i)_2$, and $V(i)_6$.

For the distinguishing code patterns MSU1 and MSU2 of the middle physical page on the left of the dividing read voltage $V(i)_2$, the enhanced read circuit 2152 can read the plurality of memory cells of the upper physical page by using the dividing read voltages $V(i)_4$ and $V(i)_2$ and the corresponding transition read voltage $V(i)_1$ to the distinguishing codes "111 111 110 110" of the plurality of memory cells of the corresponding upper physical page (step S33).

Then, the enhanced read circuit 2152 can read the plurality of memory cells of the upper physical page respectively by using the assisting read voltage $VL(i)_1$ and the assisting read voltage $VR(i)i$ corresponding to the transition read voltage $V(i)_1$ to obtain a corresponding assisting bit "0 1 1 0" (step S34). Finally, the enhanced read circuit 2152 can combine the distinguishing codes "111 111 110 110" of the upper physical page and the corresponding assisting bit value "0 1 1 0" to form an enhanced read bit value "1110 1111 1101 1100". In the same manner, the enhanced read circuit 2152 can obtain the enhanced read bit value "1000 1001 1011 1010" corresponding to the transition read voltage $V(i)_3$; the enhanced read bit value "0010 0011 0001 0000" corresponding to the transition read voltage $V(i)_5$; the enhanced read bit value "0100 0101 0111 0110" corresponding to the transition read voltage $V(i)_7$.

It should be that in the example of FIG. 9C, it is shown that the plurality of bit pairs of the formed enhanced read bit value "1110 1111 1101 1100", the enhanced read bit value "1000 1001 1011 1010", the enhanced read bit value "0010 0011 0001 0000" and the enhanced read bit value "0100 0101 0111 0110" are all different from each other (there are no two identical bit pairs). That is, the processor 211 or the error checking and correcting circuit 214 can identify the distinguishing code pattern to which each bit pair in the enhanced read bit value "1110 1111 1101 1100", the enhanced read bit value "1000 1001 1011 1010", the enhanced read bit value "0010 0011 0001 0000", and the enhanced read bit value "0100 0101 0111 0110" belongs, the corresponding transition read voltage and the corresponding reliability through the plurality of bit pairs of the enhanced read bit value "1110 1111 1101 1100", the enhanced read bit value "1000 1001 1011 1010", the enhanced read bit value "0010 0011 0001 0000", and the enhanced read bit value "0100 0101 0111 0110".

It should be noted that, in the above various embodiments, the read assisting circuit unit 215 is implemented as a hardware circuit, but the present disclosure is not limited thereto. For example, in an embodiment, the read assisting circuit unit 215 can be implemented in the manner of software as a read assisting program code module having the function of the read assisting circuit unit 215. The read assisting program code module can include a distinguishing code management program code module and an enhanced read program code module. The distinguishing code management program code module is a program code module having the function of the distinguishing code management circuit 2151; and the enhanced read program code module is a program code module having the function of the enhanced read circuit 2152. The processor 211 can access and execute the read assisting program code module (or the distinguishing code management program code module and the enhanced read program code module) to implement the data reading method (or read assisting method) provided by the present disclosure.

In summary, the data reading method, the storage controller and the storage device provided in the embodiments of the present disclosure can perform the read assisting operation of the target physical page corresponding to the target wordline on any programmed target wordline without preparing the verified data. In the read assisting operation, the storage controller identifies a plurality of distinguishing code patterns corresponding to the target physical page and a plurality of corresponding transition read voltages, and respectively uses the plurality of transition read voltages and a plurality of corresponding assisting read voltage sets to obtain a plurality of distinguishing codes and a plurality of assisting bit values of the plurality of target memory cells of the target physical page to obtain an enhanced read bit value of each of the plurality of target memory cells, thereby completing the read assisting operation corresponding to the target physical page. In this way, the accuracy and reliability of the data read from the target wordline can be improved, so as to reduce the load on the decoding operation performed on the read data, thereby improving the overall efficiency of the data reading operation.

Although the disclosure has been disclosed by the above embodiments, the embodiments are not intended to limit the disclosure. It will be apparent to those skilled in the art that various modifications and variations can be made to the structure of the disclosure without departing from the scope or spirit of the disclosure. Therefore, the protecting range of the disclosure falls in the appended claims.

What is claimed is:

1. A data reading method, adapted for a storage device configured with a rewritable non-volatile memory module, wherein the rewritable non-volatile memory module has a plurality of wordlines, wherein each of the plurality of wordlines is coupled to a plurality of memory cells, wherein each of the plurality of memory cells comprises a plurality of physical pages, and each of the plurality of physical pages is configured to be programmed into a bit value, the method comprising:

selecting a target wordline of the plurality of wordlines of the rewritable non-volatile memory module and selecting a target physical page in the target wordline, wherein a plurality target memory cells of the target wordline have been programmed;

identifying P distinguishing code patterns corresponding to the target physical page, and identifying, according to a preset read voltage set corresponding to the target wordline, Q transition read voltages corresponding to the P distinguishing code patterns in the preset read voltage set, wherein the P is a positive integer, and Q is a positive integer smaller than P;

reading the target physical page by using the Q transition read voltages to obtain a distinguishing code of each of the plurality of target memory cells of the target physical page;

reading the target physical page by using Q assisting read voltage sets corresponding to the Q transition read voltages to obtain an assisting bit value of each of the plurality of target memory cells of the target physical page; and combining the distinguishing code and the assisting bit value of each of the plurality of target memory cells to obtain an enhanced read bit value of each of the plurality of target memory cells.

2. The data reading method according to claim 1, wherein the P distinguishing code patterns are set by performing a distinguishing code pattern setting operation corresponding to the target physical page, and the distinguishing code pattern setting operation comprises the following steps:

(1) identifying Q transition read voltages corresponding to the target physical page according to a preset read voltage set corresponding to the target wordline, wherein a plurality of storage states of the target physical page are divided by the Q transition read voltages;

(2) initially setting a plurality of target storage states according to M storage states of the target physical page, wherein a total number of the plurality of target storage states is M, and M is a positive integer greater than one;

(3) determining whether a total number of the Q transition read voltages is equal to 1, wherein in response to determining that the total number of the Q transition read voltages is equal to 1, performing step (7), wherein in response to determining that the total number of the Q transition read voltages is not equal to 1, performing step (4);

(4) determining, according to a plurality of current bit value sets of the plurality of target storage states, whether the plurality of target storage states are all different, wherein in response to determining that the plurality of target storage states are all different, performing step (7), wherein in response to determining that the plurality of target storage states are not all different, performing step (5);

(5) selecting, according to a sequence of the physical page, a first candidate physical page arranged first from one or more non-selected candidate physical pages among the plurality of candidate physical pages, and identifying a plurality of first candidate storage states of the first candidate physical page, wherein the plurality of first candidate storage states are divided by one or more candidate transition read voltages, wherein step (5) continues to step (6);

(6) changing the plurality of target storage states from a plurality of current bit value sets to a plurality of adjusted bits values sets according to the plurality of first candidate storage states and the one or more candidate transition read voltages, wherein a total number of the adjusted bits values sets is greater than a total number of the plurality of current bit value sets, and a bit amount of each of the adjusted bits values sets is greater than a bit amount of each of the plurality of current bit value sets, wherein step (6) continues to step (4); and (7) setting the plurality of current bit value sets of the plurality of target storage states as a plurality of distinguishing code patterns corresponding to the target physical page to complete the distinguishing code pattern setting operation corresponding to the target physical page.

3. The data reading method according to claim 2, wherein the step (3) in the distinguishing code pattern setting operation comprises:

in response to determining that the total number of the Q transition read voltages is not equal to 1, not performing step (4), but determining whether the total number of the Q transition read voltages is greater than a predetermined threshold, wherein in response to determining that the total number of the Q transition read voltages is not greater than the predetermined threshold, performing step (4), wherein in response to determining that the total number of the Q transition read voltages is greater than the predetermined threshold, directly setting a plurality of gray codes of the memory cell as a plurality of distinguishing code patterns corresponding to the target physical page, thereby completing the distinguishing code pattern setting operation corresponding to the target physical page.

4. The data reading method according to claim 3, wherein the step of performing the first type read voltage optimization operation, the second type read voltage optimization operation or the third type read voltage optimization operation corresponding to the target wordline according to the target optimization count value comprises:

wherein if each memory cell of the rewritable non-volatile memory module comprises a lower physical page, a middle physical page and an upper physical page, a plurality of storage states of the lower physical page are divided by one transition read voltage, a plurality of storage states of the middle physical page are divided by two transition read voltages, and a plurality of storage states of the upper physical page are divided by four transition read voltages, the rewritable non-volatile memory module is a first read voltage mode, wherein a plurality of distinguishing code patterns corresponding to the lower physical page are set to "1" and "0", a plurality of distinguishing code patterns corresponding to the middle physical page are set to "11", "10", "00", and "01", and a plurality of distinguishing code patterns corresponding to the upper physical page are set to "111", "110", "100", "101", "001", "000", "010" and "011", wherein if each memory cell of the rewritable non-volatile memory module comprises a lower physical page, a middle physical page and an upper physical page, a plurality of storage states of the lower physical page are divided by two transition read voltages, a plurality of storage states of the middle physical page are divided by three transition read voltages, and a plurality of storage states of the upper physical page are divided by two transition read voltages, the rewritable non-volatile memory module is a second read voltage mode, wherein a plurality of distinguishing code patterns corresponding to the lower physical page, the middle physical page and the upper physical page are all set to "111", "110", "100", "101", "001", "000", "010" and "011".

5. The data reading method according to claim 1, wherein for a j-th assisting read voltage set corresponding to a j-th transition read voltage of the Q transition read voltages among the Q assisting read voltage sets having a left assisting read voltage and a right assisting read voltage,
wherein a voltage value of the left assisting read voltage corresponding to the j-th transition read voltage is a voltage value of the j-th transition read voltage minus a first preset voltage offset,
wherein a voltage value of the right assisting read voltage corresponding to the j-th transition read voltage is the voltage value of the j-th transition read voltage plus a second preset voltage offset, where j is a positive integer smaller than or equal to Q.

6. The data reading method according to claim 5, wherein the first preset voltage offset is equal to the second preset voltage offset.

7. The data reading method according to claim 5, wherein the step of reading the target physical page by using the Q assisting read voltage sets corresponding to the Q transition read voltages to obtain the assisting bit value of each of the plurality of target memory cells of the target physical page comprises:
regarding a j-th assisting read voltage set corresponding to the j-th transition read voltage of the Q transition read voltages in the Q assisting read voltage sets, reading the target physical page by using the left assisting read voltage of the j-th assisting read voltage set, so as to obtain a left assisting bit value of each of the plurality of target memory cells;
reading the target physical page by using the right assisting read voltage of the j-th assisting read voltage set, so as to obtain a right assisting bit value of each of the plurality of target memory cells; and
calculating the left assisting bit value and the right assisting bit value of each of the plurality of target memory cells through an XOR operation or an XNOR operation, and using an obtained first operation result corresponding to the XOR operation or a second operation result corresponding to the XNOR operation as the assisting bit value of each of the plurality of target memory cells.

8. A storage controller, configured to control a storage device equipped with a rewritable non-volatile memory module, the storage controller comprising:
a connection interface circuit, coupled to a host system;
a memory interface control circuit, coupled to the rewritable non-volatile memory module, wherein the rewritable non-volatile memory module has a plurality of wordlines, wherein each of the plurality wordlines is coupled to a plurality of memory cells, wherein each of the plurality of memory cells comprises a plurality of physical pages, and each of the plurality of physical pages is configured to be programmed to a bit value;
a read assisting circuit unit; and
a processor, coupled to the connection interface circuit, the memory interface control circuit, and the read assisting circuit unit,
wherein the processor is configured to select a target wordline of the plurality of wordlines of the rewritable non-volatile memory module, and select a target physical page in the target wordline, wherein a plurality of target memory cells of the target wordline have been programmed,
wherein the read assisting circuit unit is configured to identify P distinguishing code patterns corresponding to the target physical page, and identify Q transition read voltages corresponding to the P distinguishing code patterns in a preset read voltage set according to the preset read voltage set corresponding to the target wordline, wherein the P is a positive integer, and Q is a positive integer smaller than P,
wherein the reading assisting circuit unit is further configured to read the target physical page by using the Q transition read voltages to obtain a distinguishing code of each of the plurality of target memory cells of the target physical page,
wherein the read assisting circuit unit is further configured to read the target physical page by using Q assisting read voltage sets corresponding to the Q transition read voltages to obtain an assisting bit value of each of the plurality of target memory cells of the target physical pages,
wherein the read assisting circuit unit is further configured to combine the distinguishing code and the assisting bit value of each of the plurality of target memory cells to obtain an enhanced read bit value of each of the plurality of target memory cells.

9. The storage controller according to claim 8, wherein the P distinguishing code patterns are set by performing a distinguishing code pattern setting operation corresponding to the target physical page through the read assisting circuit unit, and the distinguishing code pattern setting operation comprises the following steps:
(1) identifying Q transition read voltages corresponding to the target physical page according to a preset read voltage set corresponding to the target wordline, wherein a plurality of storage states of the target physical page are divided by the Q transition read voltages;
(2) initially setting a plurality of target storage states according to M storage states of the target physical page, wherein a total number of the plurality of target storage states is M, and M is a positive integer greater than one;
(3) determining whether a total number of the Q transition read voltages is equal to 1,
wherein in response to determining that the total number of the Q transition read voltages is equal to 1, performing step (7),
wherein in response to determining that the total number of the Q transition read voltages is not equal to 1, performing step (4);
(4) determining, according to a plurality of current bit value sets of the plurality of target storage states, whether the plurality of target storage states are all different,
wherein in response to determining that the plurality of target storage states are all different, performing step (7),
wherein in response to determining that the plurality of target storage states are not all different, performing step (5);
(5) selecting, according to a sequence of the physical page, a first candidate physical page arranged first from one or more non-selected candidate physical pages among the plurality of candidate physical pages, and identifying a plurality of first candidate storage states of the first candidate physical page, wherein the plurality of first candidate storage states are divided by the one or more candidate transition read voltages, wherein step (5) continues to step (6);

(6) changing the plurality of target storage states from a plurality of current bit value sets to a plurality of adjusted bits values sets according to the plurality of first candidate storage states and the one or more candidate transition read voltages, wherein a total number of the adjusted bits values sets is greater than a total number of the plurality of current bit value sets, and a bit amount of each of the adjusted bits values sets is greater than a bit amount of each of the plurality of current bit value sets, wherein step (6) continues to step (4); and (7) setting the plurality of current bit value sets of the plurality of target storage states as a plurality of distinguishing code patterns corresponding to the target physical page to complete the distinguishing code pattern setting operation corresponding to the target physical page.

10. The storage controller according to claim 9, wherein the step (3) in the distinguishing code pattern setting operation comprises:

in response to determining that the total number of the Q transition read voltages is not equal to 1, not performing step (4), but determining whether the total number of the Q transition read voltages is greater than a predetermined threshold, wherein in response to determining that the total number of the Q transition read voltages is not greater than the predetermined threshold, performing step (4), wherein in response to determining that the total number of the Q transition read voltages is greater than the predetermined threshold, directly setting a plurality of gray codes of the memory cell as a plurality of distinguishing code patterns corresponding to the target physical page, thereby completing the distinguishing code pattern setting operation corresponding to the target physical page.

11. The storage controller according to claim 8, wherein if each memory cell of the rewritable non-volatile memory module comprises a lower physical page, a middle physical page and an upper physical page, a plurality of storage states of the lower physical page are divided by one transition read voltage, a plurality of storage states of the middle physical page are divided by two transition read voltages, and a plurality of storage states of the upper physical page are divided by four transition read voltages, the rewritable non-volatile memory module is a first read voltage mode, wherein a plurality of distinguishing code patterns corresponding to the lower physical page are set to "1" and "0", a plurality of distinguishing code patterns corresponding to the middle physical page are set to "11", "10", "00", and "01", and a plurality of distinguishing code patterns corresponding to the upper physical page are set to "111", "110", "100", "101", "001", "000", "010" and "011", wherein if each memory cell of the rewritable non-volatile memory module comprises a lower physical page, a middle physical page and an upper physical page, a plurality of storage states of the lower physical page are divided by two transition read voltages, a plurality of storage states of the middle physical page are divided by three transition read voltages, and a plurality of storage states of the upper physical page are divided by two transition read voltages, the rewritable non-volatile memory module is a second read voltage mode, wherein a plurality of distinguishing code patterns corresponding to the lower physical page, the middle physical page and the upper physical page are all set to "111", "110", "100", "101", "001", "000", "010" and "011".

12. The storage controller according to claim 8, wherein the Q assisting read voltage sets are set through the read assisting circuit unit, wherein for a j-th assisting read voltage set corresponding to a j-th transition read voltage of the Q transition read voltages among the Q assisting read voltage sets having a left assisting read voltage and a right assisting read voltage, wherein a voltage value of the left assisting read voltage corresponding to the j-th transition read voltage is a voltage value of the j-th transition read voltage minus a first preset voltage offset, wherein a voltage value of the right assisting read voltage corresponding to the j-th transition read voltage is the voltage value of the j-th transition read voltage plus a second preset voltage offset, where j is a positive integer smaller than or equal to Q.

13. The storage controller according to claim 12, wherein the first preset voltage offset is equal to the second preset voltage offset.

14. The storage controller according to claim 12, wherein in the operation of reading the target physical page by using the Q assisting read voltage sets corresponding to the Q transition read voltages to obtain the assisting bit value of each of the plurality of target memory cells of the target physical page, regarding a j-th assisting read voltage set corresponding to the j-th transition read voltage of the Q transition read voltages in the Q assisting read voltage sets, the read assisting circuit unit reads the target physical page by using the left assisting read voltage of the j-th assisting read voltage set, so as to obtain a left assisting bit value of each of the plurality of target memory cells, wherein the read assisting circuit unit reads the target physical page by using the right assisting read voltage of the j-th assisting read voltage set, so as to obtain a right assisting bit value of each of the plurality of target memory cells, wherein the read assisting circuit unit calculates the left assisting bit value and the right assisting bit value of each of the plurality of target memory cells through an XOR operation or an XNOR operation, and uses an obtained first operation result corresponding to the XOR operation or a second operation result corresponding to the XNOR operation as the assisting bit value of each of the plurality of target memory cells.

15. A storage device, the storage device comprising:

a rewritable non-volatile memory module, wherein the rewritable non-volatile memory module has a plurality of wordlines, wherein each of the wordlines is coupled to a plurality of memory cells, wherein each of the plurality of the memory cells comprises a plurality of physical pages, and each of the plurality of physical pages is configured to be programmed into a bit value;

a memory interface control circuit, coupled to the rewritable non-volatile memory module; and a processor, coupled to the memory interface control circuit, wherein the processor loads and executes a read assisting program code module to implement a data reading method, and the data reading method comprises the following steps:

selecting a target wordline of the plurality of wordlines of the rewritable non-volatile memory module and selecting a target physical page in the target wordline, and performing a read assisting operation on the target physical page, wherein a plurality target memory cells of the target wordline have been programmed, the read assisting operation comprises the following steps:

identifying P distinguishing code patterns corresponding to the target physical page, and identifying, according to a preset read voltage set corresponding to the target wordline, Q transition read voltages corresponding to the P distinguishing code patterns in the preset read voltage set, wherein the P is a positive integer, and Q is a positive integer smaller than P;

reading the target physical page by using the Q transition read voltages to obtain a distinguishing code of each of the plurality of target memory cells of the target physical page;

reading the target physical page by using Q assisting read voltage sets corresponding to the Q transition read voltages to obtain an assisting bit value of each of the plurality of target memory cells of the target physical page; and combining the distinguishing code and the assisting bit value of each of the plurality of target memory cells to obtain an enhanced read bit value of each of the plurality of target memory cells.

* * * * *